(12) United States Patent
Kusaki et al.

(10) Patent No.: US 8,541,158 B2
(45) Date of Patent: Sep. 24, 2013

(54) POSITIVE RESIST COMPOSITIONS AND PATTERNING PROCESS

(75) Inventors: Wataru Kusaki, Joetsu (JP); Takeshi Kinsho, Joetsu (JP); Takeru Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 211 days.

(21) Appl. No.: 13/013,143

(22) Filed: Jan. 25, 2011

(65) Prior Publication Data

US 2011/0183262 A1 Jul. 28, 2011

(30) Foreign Application Priority Data

Jan. 26, 2010 (JP) ................. 2010-013777

(51) Int. Cl.
*G03F 7/039* (2006.01)
*G03F 7/20* (2006.01)
*G03F 7/30* (2006.01)
*G03F 7/38* (2006.01)

(52) U.S. Cl.
USPC ........ 430/270.1; 430/311; 430/326; 430/330; 430/910; 430/942

(58) Field of Classification Search
None
See application file for complete search history.

(56) References Cited

U.S. PATENT DOCUMENTS

| | | | |
|---|---|---|---|
| 5,124,466 A * | 6/1992 | Azechi et al. | ................. 556/425 |
| 6,071,670 A * | 6/2000 | Ushirogouchi et al. | ... 430/270.1 |
| 6,312,867 B1 | 11/2001 | Kinsho et al. | |
| 6,511,785 B1 | 1/2003 | Takemura et al. | |
| 6,673,518 B2 | 1/2004 | Nishi et al. | |
| 6,830,866 B2 | 12/2004 | Kobayashi et al. | |
| 7,537,880 B2 | 5/2009 | Harada et al. | |
| 2002/0106580 A1 * | 8/2002 | Nitta et al. | ................. 430/270.1 |
| 2004/0170918 A1 * | 9/2004 | Maesawa et al. | .......... 430/270.1 |
| 2006/0234153 A1 * | 10/2006 | Nishimura et al. | ........ 430/270.1 |
| 2007/0172768 A1 * | 7/2007 | Kanna et al. | ................. 430/311 |
| 2008/0102407 A1 * | 5/2008 | Ohsawa et al. | ............ 430/286.1 |
| 2008/0153030 A1 | 6/2008 | Kobayashi et al. | |
| 2009/0142699 A1 * | 6/2009 | Furuya et al. | ............. 430/286.1 |
| 2009/0274978 A1 | 11/2009 | Ohashi et al. | |
| 2012/0157368 A1 * | 6/2012 | Mizuta et al. | ................. 510/176 |

FOREIGN PATENT DOCUMENTS

| | | |
|---|---|---|
| JP | 11-167205 A | 6/1999 |
| JP | 2000-336121 A | 12/2000 |
| JP | 2001-142199 A | 5/2001 |
| JP | 2003-64134 A | 3/2003 |
| JP | 2003-66612 A | 3/2003 |
| JP | 2004-4669 A | 1/2004 |
| JP | 2008-111103 A | 5/2008 |
| JP | 2008-158339 A | 7/2008 |
| JP | 2009-269953 A | 11/2009 |

OTHER PUBLICATIONS

Arimitsu et al., "Effect of Phenolic Hydroxyl Residues on the Improvement of Acid-Proliferation-Type Photoimaging Materials", Journal of Photopolymer Science and Technology, vol. 9, No. 1, 1996, pp. 29-30.

Arimitsu et al., "Sensitivity Enhancement of Chemical-Amplification-Type Photoimaging Materials by Acetoacetic Acid Derivatives", Journal of Photopolymer Science and Technology, vol. 8, No. 1, 1995, pp. 43-44.

Kudo et al., "Enhancement of the Sensitivity of Chemical-Amplification-Type Photoimaging Materials by β-Tosyloxyketone Acetals", Journal of Photopolymer Science and Technology, vol. 8, No. 1, 1995, pp. 45-46.

* cited by examiner

*Primary Examiner* — Sin J. Lee
(74) *Attorney, Agent, or Firm* — Birch, Stewart, Kolasch & Birch, LLP

(57) ABSTRACT

A positive resist composition is provided comprising an acid generator, a resin component which generates resin-solubilizing groups under the action of acid so that the resin component becomes soluble in an alkaline developer, at least some resin-solubilizing groups being carboxyl groups, and a compound for activating or condensing a carboxyl group. When processed by the lithography, the resist composition forms a resist pattern having a very high resolution and good mask fidelity.

7 Claims, 2 Drawing Sheets

POSITIVE RESIST COMPOSITIONS AND PATTERNING PROCESS

CROSS-REFERENCE TO RELATED APPLICATION

This non-provisional application claims priority under 35 U.S.C. §119(a) on Patent Application No. 2010-013777 filed in Japan on Jan. 26, 2010, the entire contents of which are hereby incorporated by reference.

TECHNICAL FIELD

This invention relates positive resist compositions suitable for microfabrication lithography with advantages of resolution, especially maximum resolution, and mask fidelity, and a patterning process using the same.

BACKGROUND OF THE INVENTION

In the recent drive for higher integration and operating speeds in LSI devices, the pattern rule is made drastically finer. Active efforts have been made on the development of microfabrication technology using deep ultraviolet (deep UV) and extreme ultraviolet (EUV) lithography. The photolithography using KrF excimer laser (wavelength 248 nm) and ArF excimer laser (wavelength 193 nm) as the light source has already established the main role in the commercial manufacture of semiconductor devices. The photolithography relying on the liquid immersion technique for implementing further miniaturization has been practiced in the commercial manufacture. While EUV and EB are considered promising for the next generation photolithography, a number of problems must be overcome before the manufacture technology can enter the commercial phase of semiconductor device production.

As the approach for improving the resolution from the aspect of photoresist film, a variety of techniques have been developed including the employment of chemically amplified reaction scheme, the addition of acid quenchers, contrast enhancement by an acid-labile leaving group requiring higher activation energy, and resolution enhancement by an acid-labile leaving group of lower activation energy in low optical image contrast regions. See Patent Documents 1 and 2.

Since a limit is foreseen in the continuing trend for shorter wavelength in the photolithography, a demand for a photoresist film having a further improved resolution is increasing toward the goal of manufacturing finer size devices at lower costs by the universal KrF and dry ArF lithography techniques.

CITATION LIST

Patent Document 1: JP-A 2008-158339 (US 2008153030)
Patent Document 2: JP-A 2003-064134
Patent Document 3: JP-A H11-167205
Patent Document 4: JP-A 2001-142199 (U.S. Pat. No. 6,511,785)
Patent Document 5: JP-A 2004-004669

DISCLOSURE OF INVENTION

An object of the present invention is to provide a positive resist composition which is suitable for microfabrication by the photolithography using high-energy radiation such as KrF or ArF excimer laser, has good resolution and mask fidelity, and allows for an improvement in maximum resolution, and a patterning process using the same.

Studying how to control a proportion of carboxyl groups generating on a resin, the inventors have found that an effective means for re-protecting carboxyl groups generated in excess on the resin is provided by adding a compound for activating or condensing a carboxyl group, specifically a carbodiimide or triazine base condensing agent, and more specifically an alcohol compound, thiol compound, primary or secondary amine, carboxylic acid amide, or nitrogen-containing compound having a carboxyl group to a resist composition. Then a resist composition having a higher resolution and best suited for precise microfabrication is obtained.

In one aspect, the invention provides a positive resist composition comprising (1) a compound which generates an acid in response to actinic light or radiation, (2) a resin component which becomes soluble in an alkaline developer under the action of an acid, the resin component generating resin-solubilizing groups under the action of acid, at least some of the resin-solubilizing groups being carboxyl groups, and (3) a compound for activating or condensing a carboxyl group.

The compound for activating or condensing a carboxyl group (3) is typically a carbodiimide or triazine base condensing agent.

The resist composition may further comprise an alcohol compound, thiol compound, primary or secondary amine, carboxylic acid amide, or nitrogen-containing compound having a carboxyl group.

The resist composition may further comprise a quencher as an acid diffusion regulator and/or a surfactant which is insoluble in water and soluble in the alkaline developer.

Embodiments of the invention in another aspect include:
a process for forming a pattern, comprising the steps of applying the positive resist composition defined above onto a substrate and heat treating to form a resist film, exposing the resist film to high-energy radiation through a photomask, optionally heat treating the film, and developing the exposed film with a developer;

a process for forming a pattern, comprising the steps of applying the positive resist composition defined above onto a substrate and heat treating to form a resist film, applying onto the resist film a protective coating which is insoluble in water and soluble in an alkaline developer, exposing the resist film to high-energy radiation through a photomask while a high refractive index liquid having a refractive index of at least 1.0 is interposed between the substrate and a projection lens, optionally heat treating the film, and developing the exposed film with a developer; and a process for forming a pattern, comprising the steps of applying the positive resist composition defined above onto a substrate and heat treating to form a resist film, writing an image in the resist film with electron beam, optionally heat treating the film, and developing the exposed film with a developer.

ADVANTAGEOUS EFFECTS OF INVENTION

The resist composition, when processed by the microfabrication technology, specifically lithography, forms a resist pattern having a very high resolution and good mask fidelity. The resist composition having a high resolution is best suited for precise microfabrication.

DESCRIPTION OF EMBODIMENTS

Figure 1:
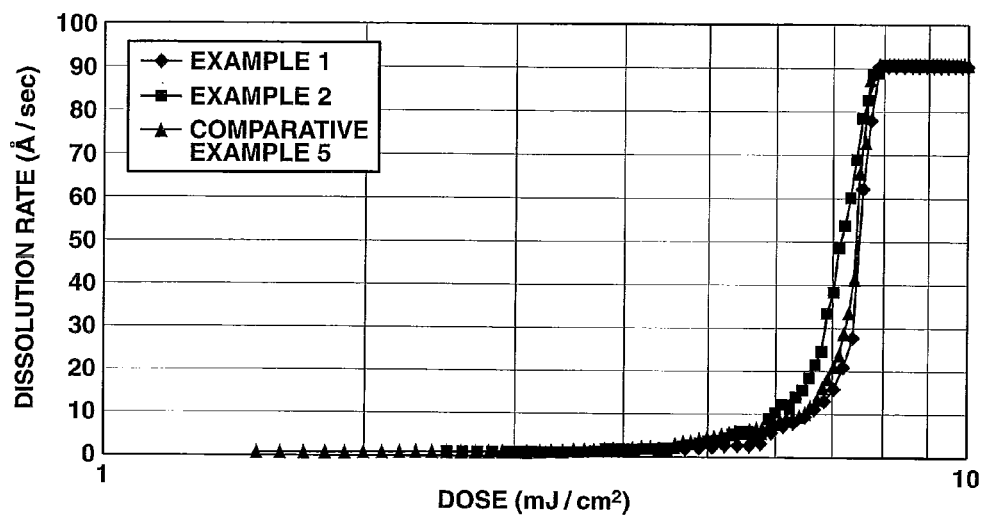
FIG. 1 is a diagram showing the results of evaluation of dissolution contrast in Examples 1 and 2 and Comparative Example 5.

The singular forms "a," "an" and "the" include plural referents unless the context clearly dictates otherwise.

The notation (Cn-Cm) means a group containing from n to m carbon atoms per group.

Below the resist composition of the invention is described in detail. It is understood that for some structures represented by chemical formulae, there can exist enantiomers and diastereomers because of the presence of asymmetric carbon. In such a case, a single formula collectively represents all such isomers. The isomers may be used alone or in admixture.

The positive resist composition is defined herein as comprising a compound which generates an acid in response to actinic light or radiation, a resin component which becomes soluble in an alkaline developer under the action of an acid, the resin component generating resin-solubilizing groups under the action of acid, at least some of the resin-solubilizing groups being carboxyl groups, and a compound for activating or condensing a carboxyl group. Typically, the compound for activating or condensing a carboxyl group, which is sometimes referred to as "inventive compound," is a carbodiimide or triazine base condensing agent.

In general, a chemically amplified resist composition is based on a resin which becomes alkali soluble under the action of an acid. This alkali solubility is attributable to the presence of resin-solubilizing groups in the resin component under the action of acid. The extent of generation of resin-solubilizing groups is a factor that determines the alkali solubility of that resin. As long as the concentration of acid generated by the photoacid generator is low, an acid quencher functions to trap the generated acid by utilizing the acid dissociation equilibrium, and then to control the action of acid on an acid-labile leaving group from which the resin-solubilizing group originates, providing a contrast of reaction. Any increase or decrease in the reactivity of acid-labile leaving group with acid is optimized in accordance with the given optical image and contributes to improvements in properties of the resulting resist pattern. Furthermore, the identity of resin-solubilizing groups generated leads to a difference in the contrast of dissolution relative to the amount of resin-solubilizing groups generated, inviting a difference in the performance of the resist film.

As mentioned above, the existing methods are intended to control the amount of generated acid contributing to reaction with acid-labile leaving group and to control the reaction of acid-labile leaving group.

According to the invention, a resin-solubilizing group generated, typically carboxyl group, is subjected to reverse reaction, specifically reaction with a carbodiimide or triazine base condensing agent, whereby the resin-solubilizing group loses its function, i.e., solubilizing ability. Further, an ester compound, known as "activating ester compound," resulting from this reaction reacts with any nucleophilic reagent to form an amide (reaction with an amine XYNH), ester (reaction with an alcohol $R_{al}OH$ or thiol $R_{al}SH$) or the like, which is considered as re-protection reaction of carboxyl group. Alkali solubility is controlled in this way. At the same time, conditions (temperature, time) of post-exposure bake (PEB) have an impact on the elimination reaction of acid-labile leaving group and the re-protection reaction contemplated herein, offering another choice of control toward the lithography results.

Reaction scheme 1

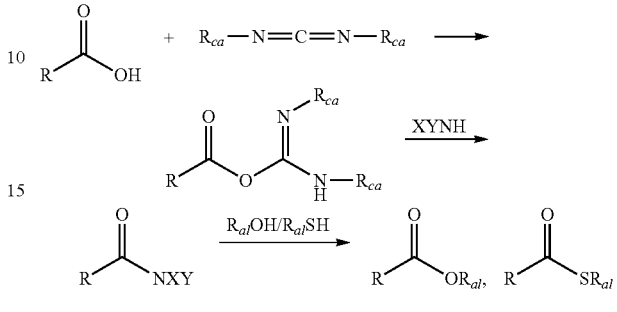

Reaction scheme 2

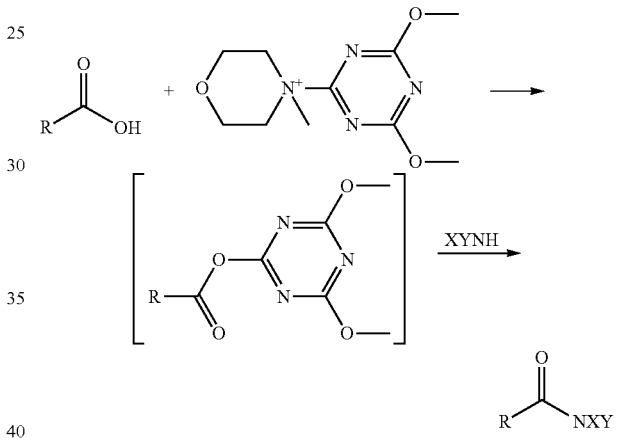

Herein, R stands for a polymer, and $R_{ca}$ of carbodiimide, $R_{al}$ of an alcohol compound or thiol compound, and X and Y of a primary or secondary amine, carboxylic acid amide, or nitrogen-containing compound having a carboxyl group are substituent groups which are described later.

In the region where the amount of acid generated is small, the behavior of a dissolution rate relative to an exposure dose is observed to hold down the initial dissolution rate to afford a higher contrast.

Optionally, the nucleophilic reagent is reacted with the activating ester compound. An alcohol compound, thiol compound, primary or secondary amine, carboxylic acid amide, or nitrogen-containing compound having a carboxyl group is added as the nucleophilic reagent, whereby the affinity of the resin to alkaline and neutral water (both used in development process) may be controlled in terms of the identity of the alcohol compound, thiol compound, primary or secondary amine, carboxylic acid amide, or nitrogen-containing compound having a carboxyl group. This affords a flexible remedy to the resulting pattern profile and resist-originating defects.

The carbodiimide and triazine base condensing agent are often used as an agent for activating a carboxyl group in order to form an amide or ester bond.

Suitable carbodiimides used herein include N,N'-dicyclohexylcarbodiimide (DCC), N-(3-dimethylaminopropyl)-N'- ethylcarbodiimide (EDC, WSC), N,N'-diisopropylcarbodiimide (DIC), 1-tert-butyl-3-ethylcarbodiimide (BEC), N,N'-di-tert-butylcarbodiimide, 1,3-di-p-toluoylcarbodiimide, bis(2,6-diisopropylphenyl)carbodiimide, bis(trimethylsilyl)carbodiimide, and 1,3-bis(2,2-dimethyl-1,3-dioxolan-4-ylmethyl)carbodiimide (BDDC).

A typical triazine base condensing agent is 4-(4,6-dimethoxy-1,3,5-triazin-2-yl)-4-methylmorpholinium chloride n-hydrate (DMT-MM, CAS No. 3945-69-5).

In the chemically amplified resist composition, the carbodiimide or triazine base condensing agent may be added in any desired amount as long as the benefits of the invention are not impaired. Typically the carbodiimide or triazine base condensing agent may be added in an amount of 0.001 to 10 parts, preferably 0.01 to 5 parts, and more preferably 0.01 to 0.5 part by weight per 100 parts by weight of the base resin. If the amount of the carbodiimide or triazine base condensing agent is in excess, there may arise problems of degraded resolution and foreign matter upon development and resist stripping. The carbodiimide or triazine base condensing agent may be used alone or in admixture of two or more. The transmittance of the resist film can be controlled by using a carbodiimide or triazine base condensing agent having a low transmittance at the exposure wavelength and adjusting its amount.

An additive or adjuvant may be added to facilitate reaction of the inventive compound. One typical additive is 1-hydroxybenzotriazole and derivatives thereof. Exemplary derivatives include (benzotriazol-1-yloxy)tris(dimethylamino)phosphonium hexafluorophosphate (BOP), (benzotriazol-1-yloxy)tripyrrolidinophosphonium hexafluorophosphate (PyBOP® by Merck), (7-azabenzotriazol-1-yloxy)tripyrrolidinophosphonium hexafluorophosphate (PyAOP), (3-diethoxyphosphoryloxy)-1,2,3-benzotriazin-4(3H)-one (DEPBP), O-(benzotriazol-1-yl)-N,N,N',N'-tetramethyluronium hexafluorophosphate (HBTU), O-(benzotriazol-1-yl)-N,N,N',N'-tetramethyluronium tetrafluoroborate (TBTU), O-(7-azabenzotriazol-1-yloxy)-N,N,N',N'-tetramethyluronium hexafluorophosphate (HATU), O-(benzotriazol-1-yl)-N,N,N',N'-bis(tetramethylene)uronium hexafluorophosphate (HBPyU), O-(benzotriazol-1-yl)-N,N,N',N'-bis(pentamethylene)uronium hexafluorophosphate (HBPipU), (benzotriazol-1-yl)dipiperidinocarbenium tetrafluoroborate (TBPipU), O-(6-chlorobenzotriazol-1-yl)-N,N,N',N'-tetramethyluronium hexafluorophosphate (HCTU), O-(6-chlorobenzotriazol-1-yl)-N,N,N',N'-tetramethyluronium tetrafluoroborate (TCTU), O-(3,4-dihydro-4-oxo-1,2,3-benzotriazin-3-yl)-N,N,N',N'-tetramethyluronium tetrafluoroborate (TDBTU), and O-(2-oxo-1(2H)pyridyl)-N,N,N',N'-tetramethyluronium tetrafluoroborate (TPTU).

As to the nucleophilic reagent, typical alcohol compounds are straight, branched or cyclic alcohols of 2 to 20 carbon atoms which may contain a heteroatom, aromatic ring, double bond or triple bond. Examples include straight ones such as ethanol, propanol, butanol, pentyl alcohol, hexyl alcohol, heptyl alcohol, and octyl alcohol; branched ones such as isopropanol and isopentanol; and cyclic ones such as cyclopentanol, cyclohexanol, cyclohexane methanol (or cyclohexanol), and cyclohexane ethanol. Suitable alcohols of cyclic monoterpene derivatives include bornan-2-ol, fencam-2-ol, p-menthan-2-ol, p-menthan-3-ol, p-menth-8-en-2-ol, p-menth-8-en-3-ol, p-mentha-1(6), 8-dien-2-ol, pinan-3-ol, pin-2-en-3-ol, and thujan-3-ol; suitable alcohols of cyclic sesquiterpene derivatives include bisabola-3,7-dien-10-ol and cedran-8-ol; a typical homosteroid derivative is 18a-homoestra-1,3,5(10)-trien-3-ol; suitable secosteroid derivatives include vitamin D2, vitamin D3, etc., aromatic ring-containing alcohols such as benzyl alcohol, 1,4-dihydro-9,10-anthracenediol, methyl 4-hydroxybenzoate, ether-containing alcohols such as 3-methoxybutanol, 3-methyl-3-methoxybutanol, 1-methoxy-2-propanol, and 1-ethoxy-2-propanol, double bond-containing alcohols such as 2-propenol, 2-butenol, and methyl-2-butenol, and triple bond-containing alcohols such as 2-propynol and 2-butynol. Suitable fluorinated alcohols are alcohol compounds having fluorine substituted thereon at positions other than α-position, preferred examples of which are compounds terminated with 1,1,1,3,3,3-hexafluoro-2-propanol, but not limited thereto.

Examples of polyhydric alcohols include cyclohexanediol, cyclohexane-triol, ethylene glycol, propylene glycol, trimethylene glycol, glycerol, erythritol, and xylitol.

Examples of thiol compounds include straight or branched alkane thiols such as methanethiol, ethanethiol, propanethiol, butanethiol, octanethiol, isobutylthiol, isopropylthiol, and 2-pentanethiol, aromatic ring-containing thiols such as benzene thiol and 4-pyridine thiol, alcohol-containing thiols such as 2-sulfanyl-1-pentanol, polyfunctional thiols such as butane-2,3-dithiol and pentaerythritol tetrakis(3-mercaptobutyrate), double bond-containing thiols such as hex-5-ene-3-thiol, and fluorinated thiols such as perfluoroalkane thiols.

Suitable primary and secondary amines and carboxylic acid amides which are similarly added may overlap with examples of the quencher to be described later.

Likewise, suitable nitrogen-containing compounds having a carboxyl group correspond to some examples of the quencher to be described later, and their examples correspond to combinations of the general formulae (B)-1 and (X)-3 to be described later, and may overlap with examples of such combinations.

The adjuvants and the alcohol compounds, thiol compounds, primary and secondary amines, carboxylic acid amides, and nitrogen-containing compounds having a carboxyl group, which are described above, may be used in any desired amount insofar as they do not compromise the benefits of the invention. Typically the reagent is added in an amount of 0 to 10 parts per 100 parts of the base resin, preferably in an amount which is 0 to 10 times, more preferably 0 to 2 times the amount of carbodiimide or triazine condensing agent added. When used, the reagent is added in an amount which is at least equal to the amount of carbodiimide or triazine condensing agent added, in order that the reagent exert its effect.

Resin Component

A preferred composition of the resin component is described below, but not limited thereto.

Typical of the resin component is a polymer or high-molecular-weight compound comprising recurring units of at least one type selected from the following general formulae (1) to (4) although a polymer comprising recurring units of formula (1) as an essential unit is preferred.

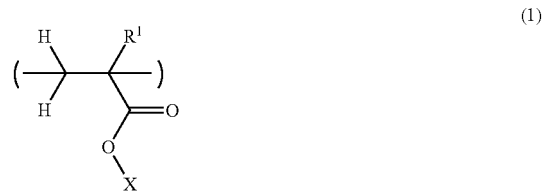

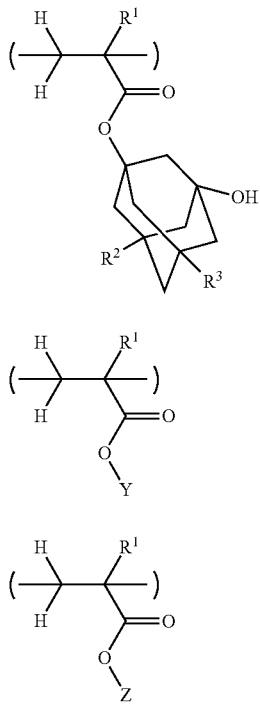

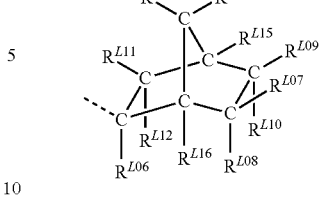

Herein $R^1$ is hydrogen, fluorine, methyl or trifluoromethyl, $R^2$ and $R^3$ are each independently hydrogen or hydroxyl, X is an acid labile group, Y is a substituent group having a lactone structure, and Z is hydrogen, a $C_1$-$C_{15}$ fluoroalkyl, or $C_1$-$C_{15}$ fluoroalcohol-containing substituent group.

A polymer comprising recurring units of formula (1) is decomposed under the action of an acid to generate a carboxylic acid so that the polymer may become alkali soluble.

The acid labile group represented by X may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

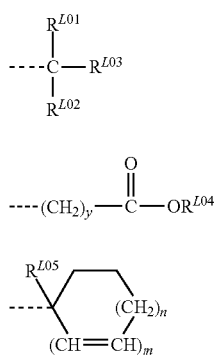

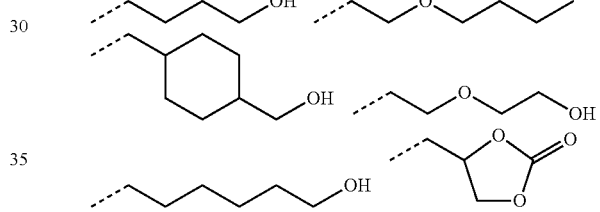

Herein the broken line denotes a valence bond.

In formula (L1), $R^{L01}$ and $R^{L02}$ are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Examples of the substituted alkyl groups are as shown below.

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. The cyclization group of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, i-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_8$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, and cyclohexyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2 m+n is equal to 2 or 3.

In formula (L4), $R^{L06}$ is an optionally substituted, straight, branched or cyclic $C_1$-$C_8$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or other groups. Alternatively, any two of $R^{L07}$ to $R^{L16}$ groups may bond together to form a ring with the carbon atom to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L06}$ which are attached to vicinal carbon atoms may bond together directly to form a double bond (for example, a pair of $R^{L07}$ and $R^{L11}$, $R^{L09}$ and $R^{L15}$, $R^{L13}$ and $R^{L15}$ or a similar pair).

Of the acid labile groups of formula (L1), the straight and branched ones are exemplified by the following groups.

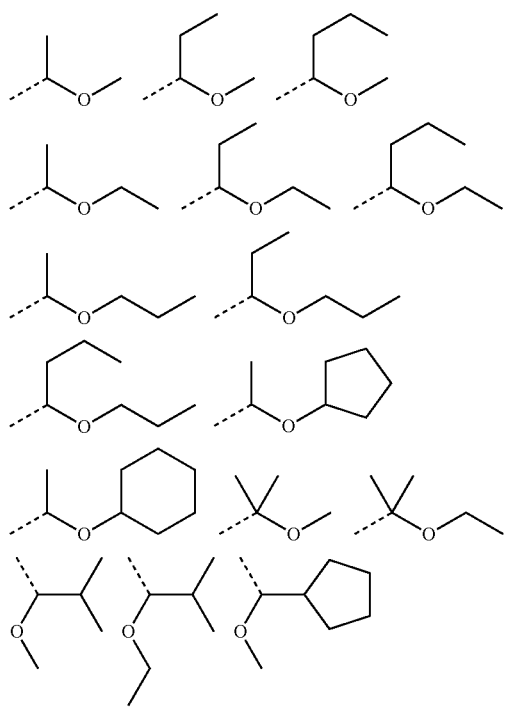

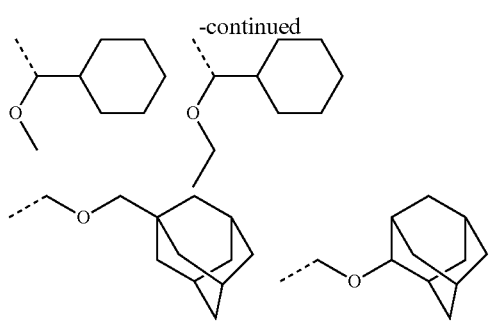

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

(L4-1)

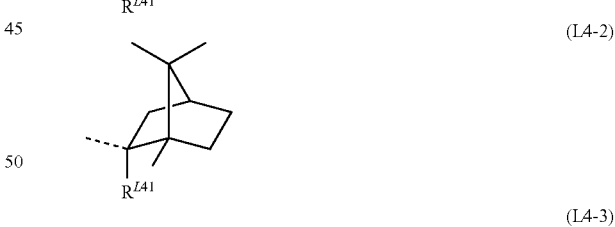

(L4-2)

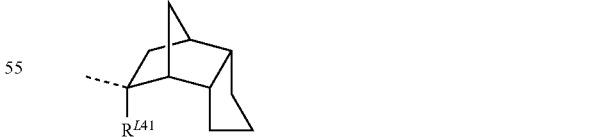

(L4-3)

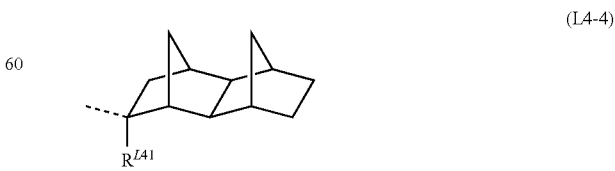

(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

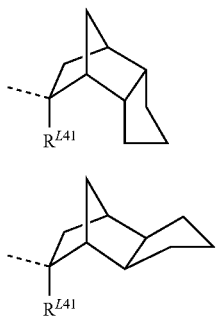

(L4-3-1)

(L4-3-2)

Similarly, the general formula (L4-4) represents one or a mixture of two or more selected from groups having the following general formulas (L4-4-1) to (L4-4-4).

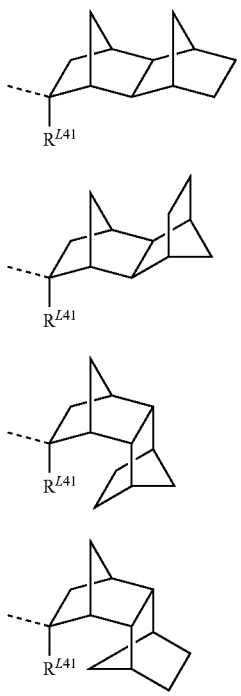

(L4-4-1)

(L4-4-2)

(L4-4-3)

(L4-4-4)

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

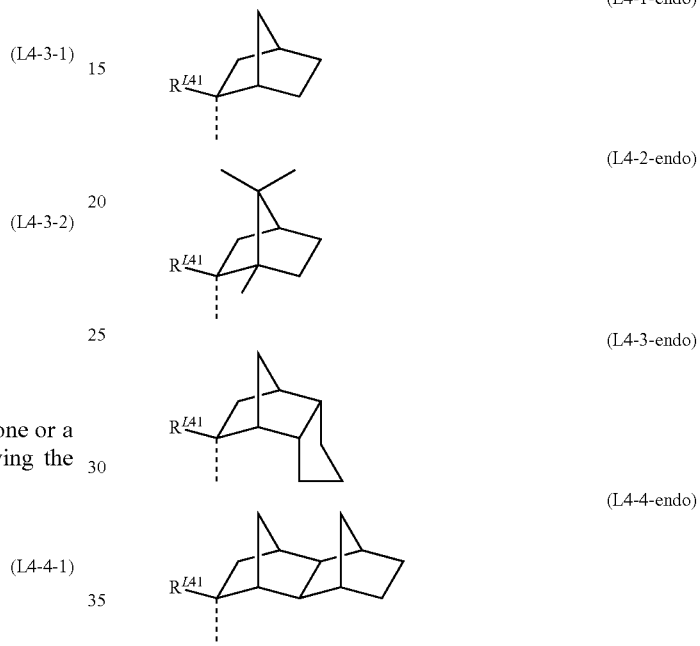

(L4-1-endo)

(L4-2-endo)

(L4-3-endo)

(L4-4-endo)

Illustrative examples of the acid labile group of formula (L4) are given below.

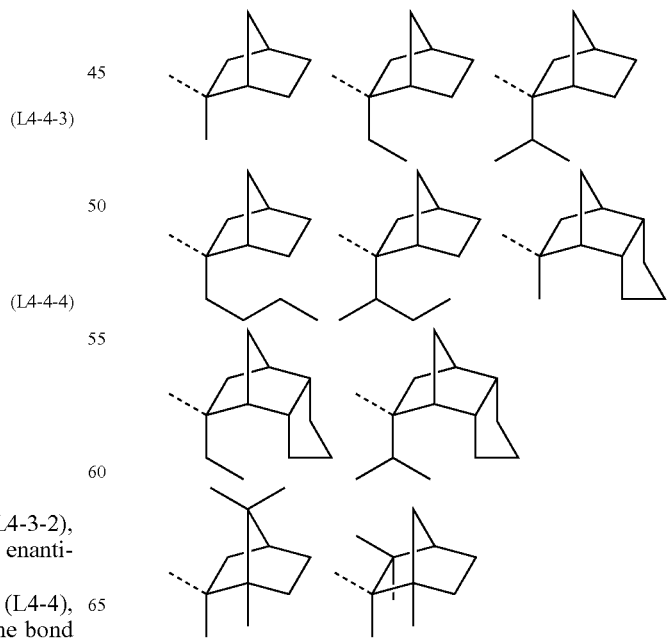

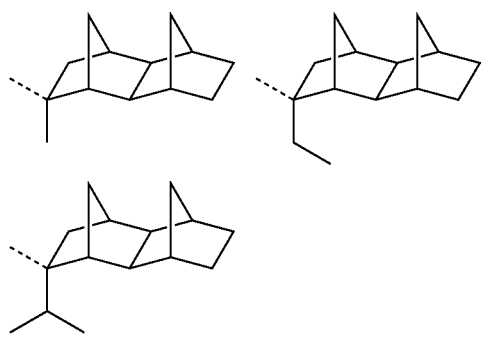
Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{L04}$ and the like.
Examples of the recurring units having formula (1) are given below, but not limited thereto.
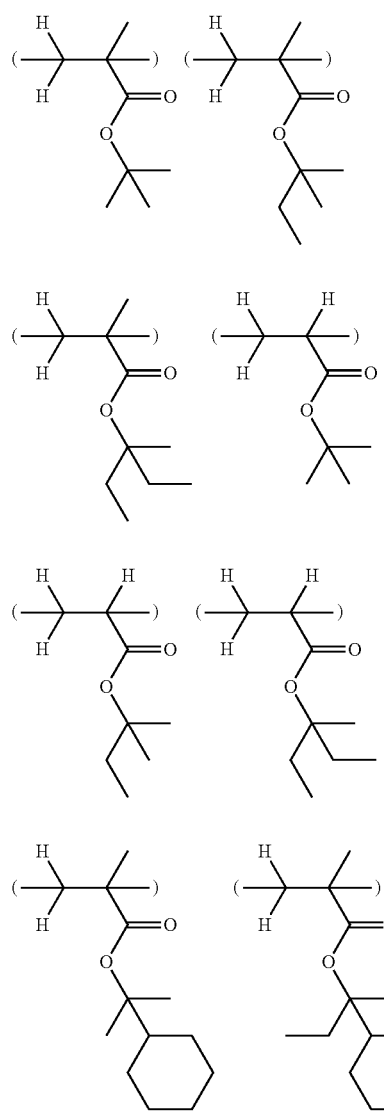
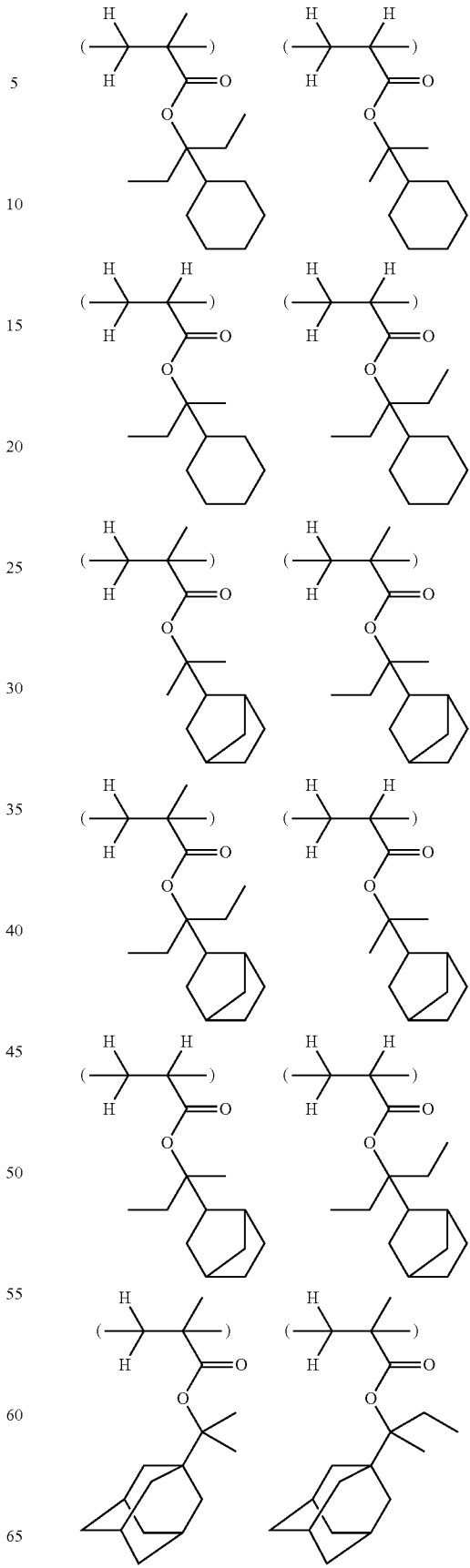

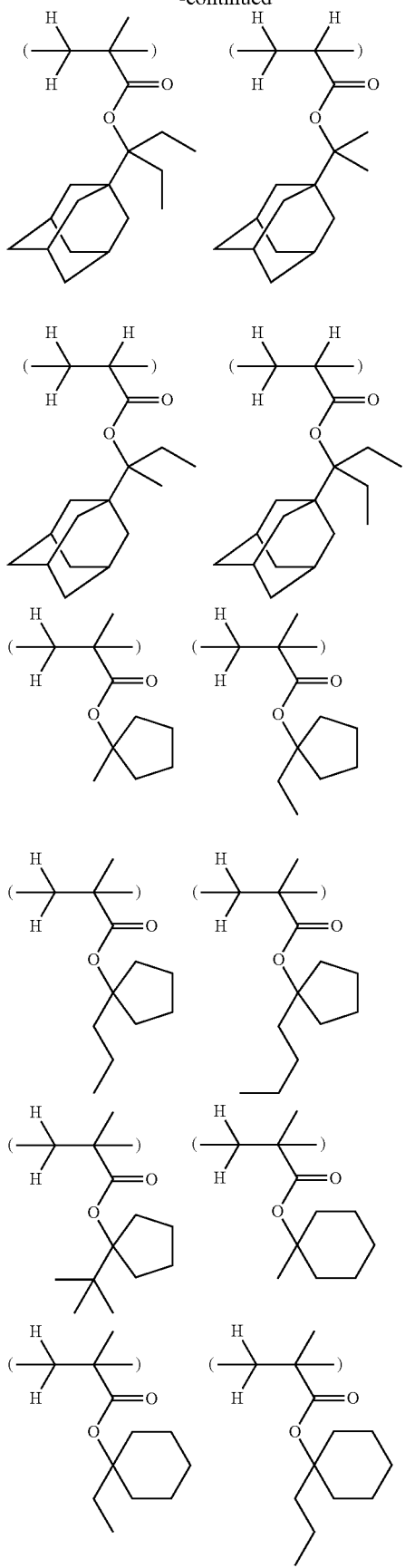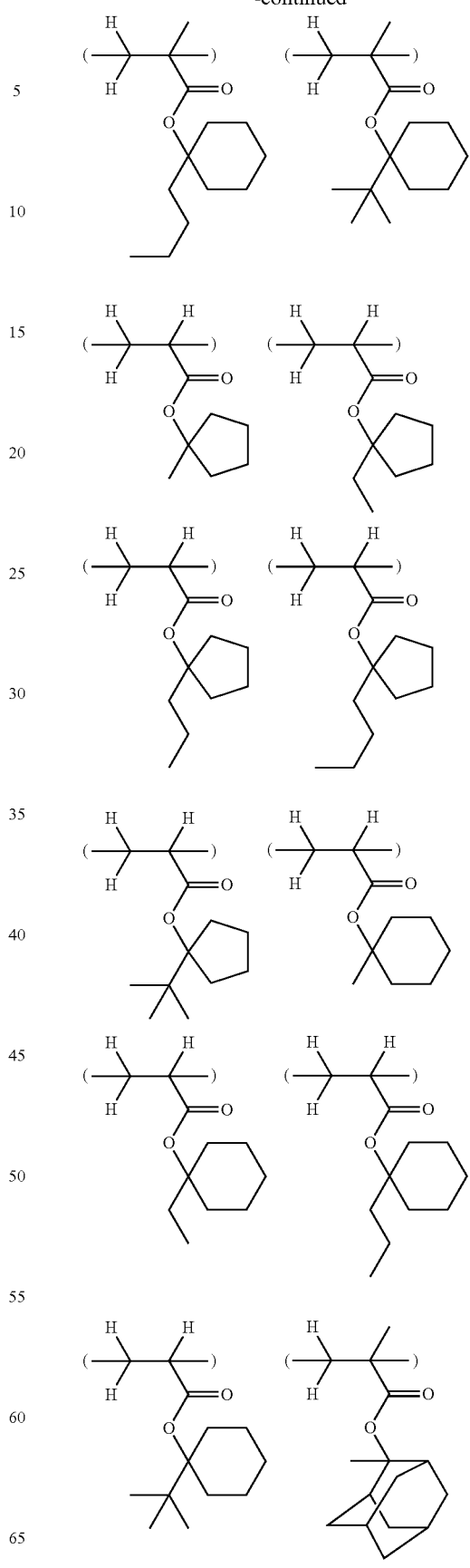

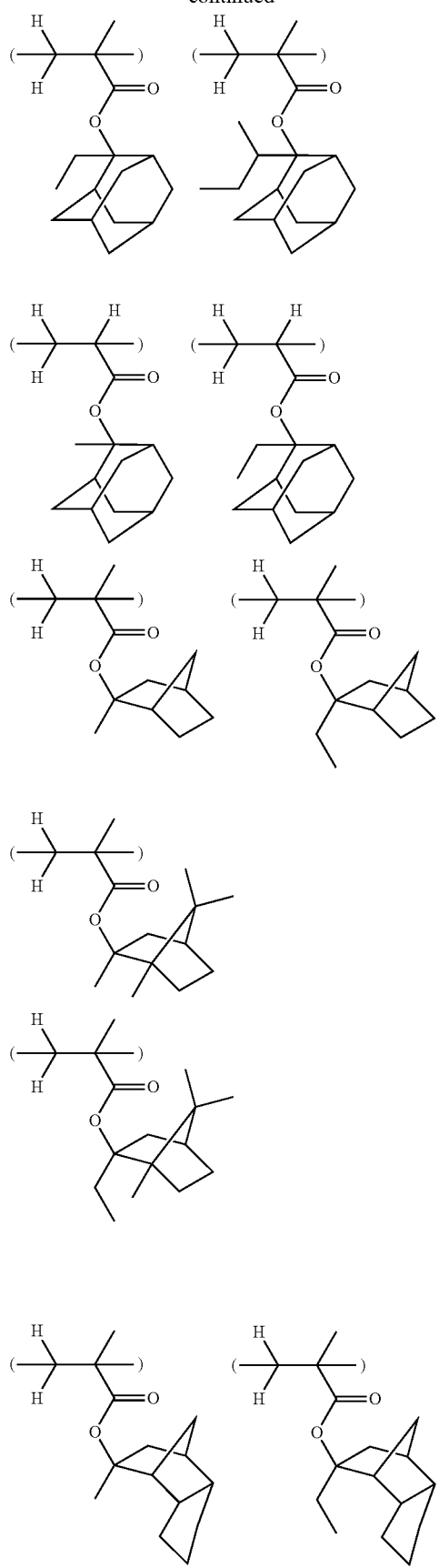
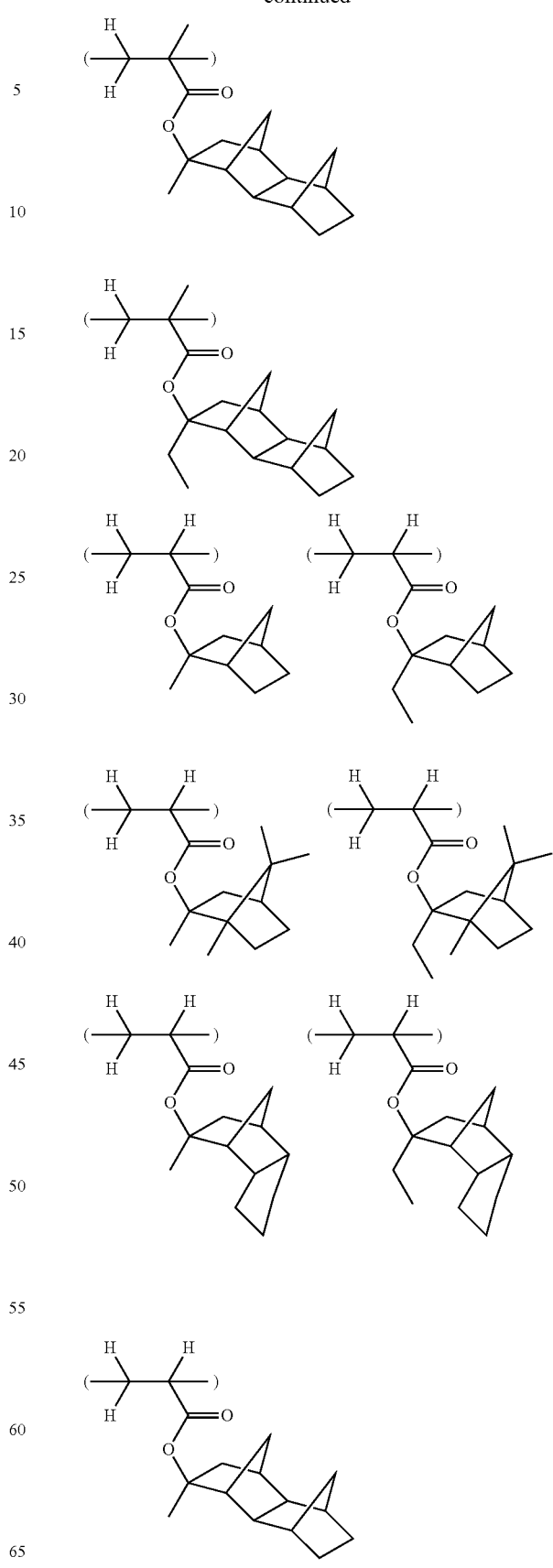

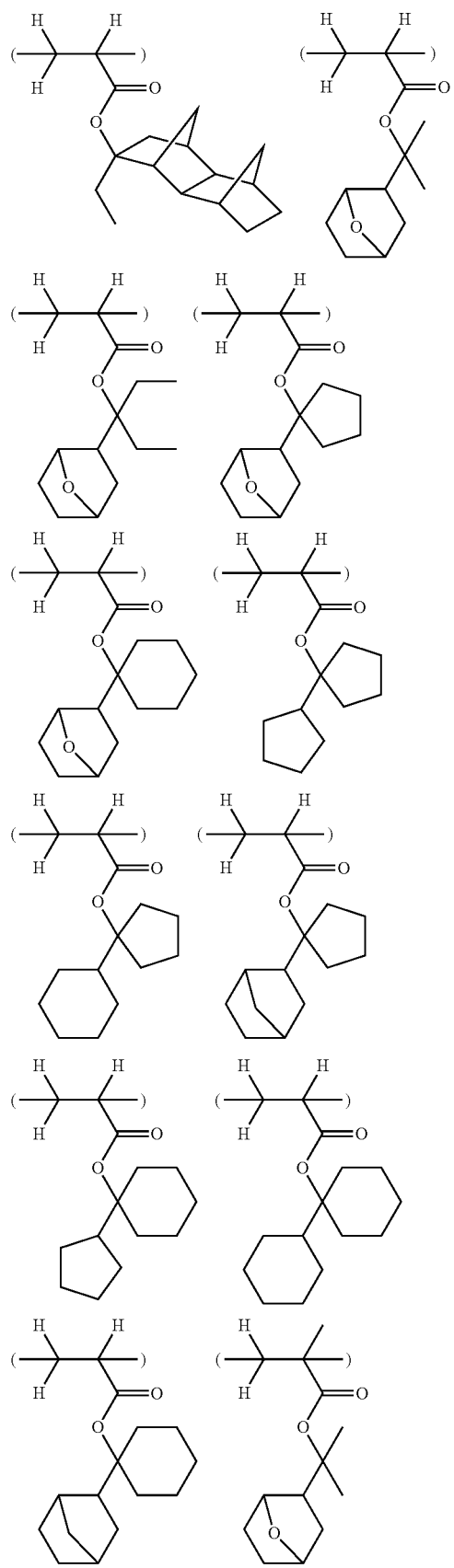
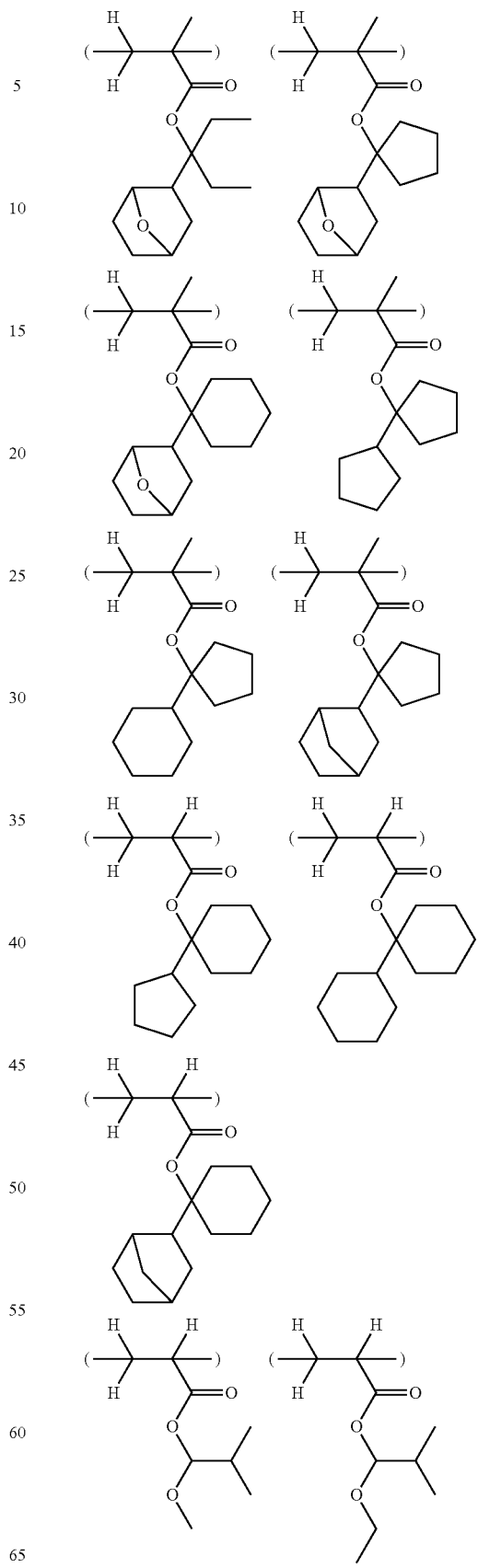

-continued
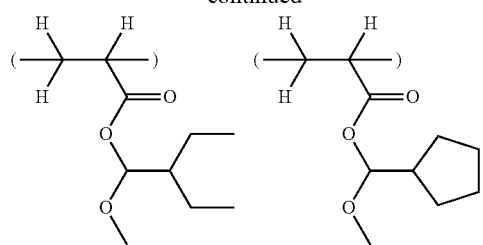
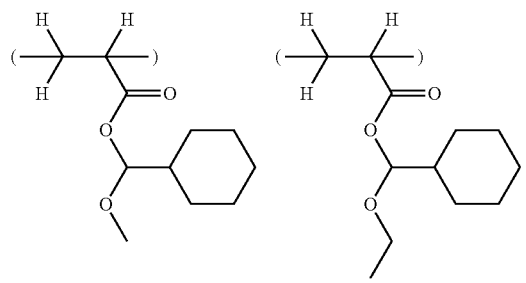
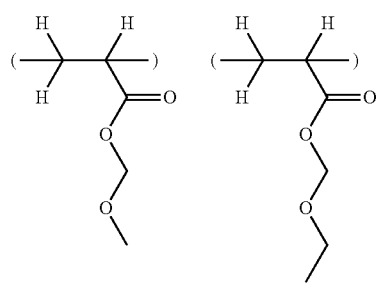
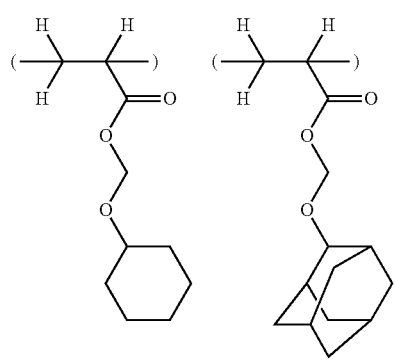
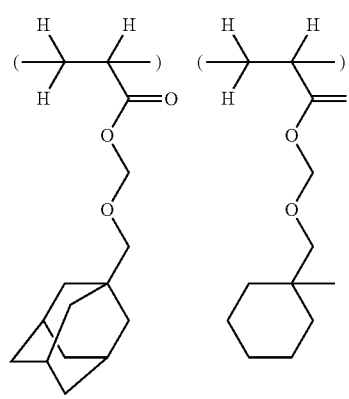
-continued
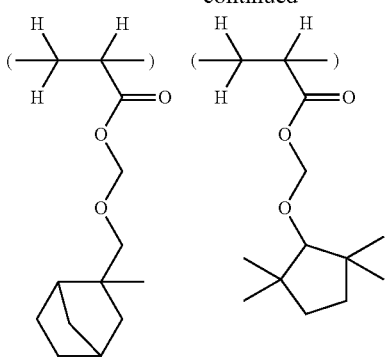
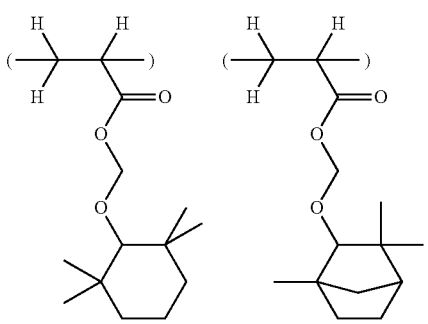
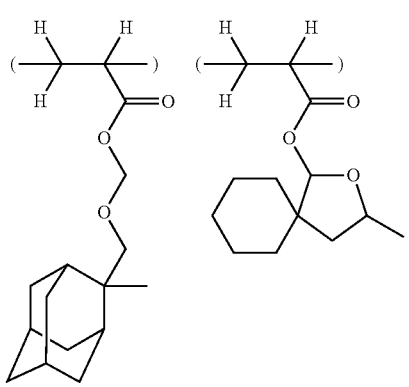
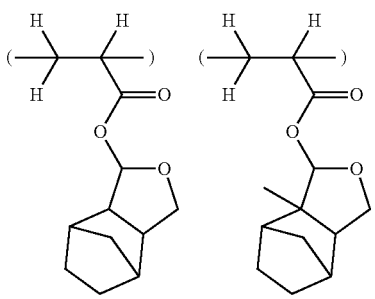
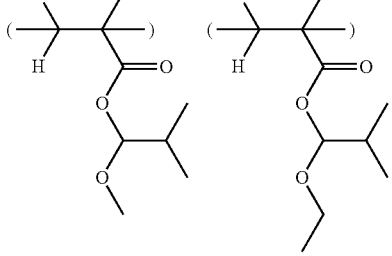

-continued
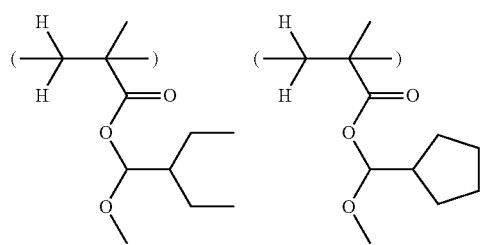
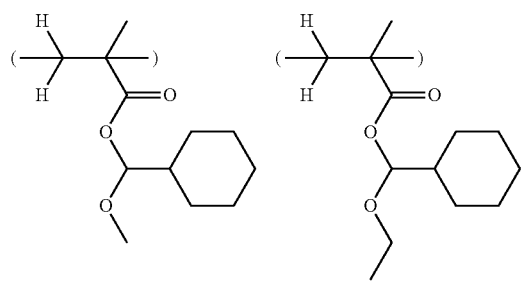
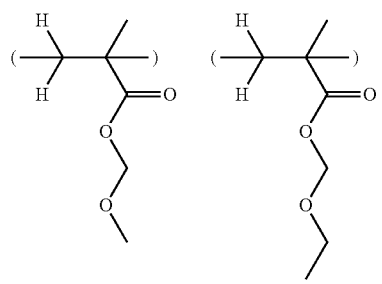
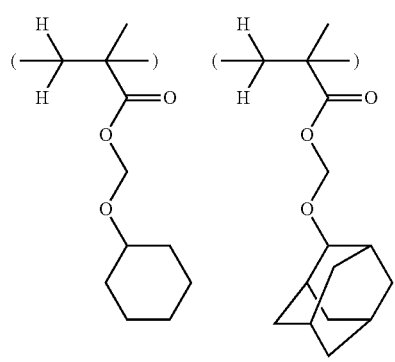
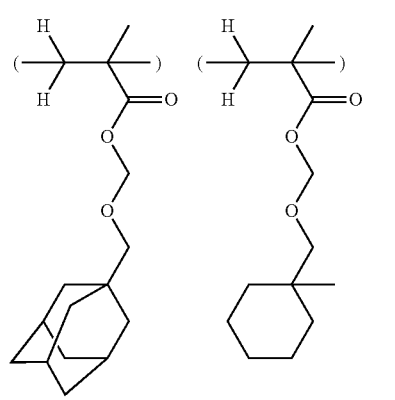
-continued
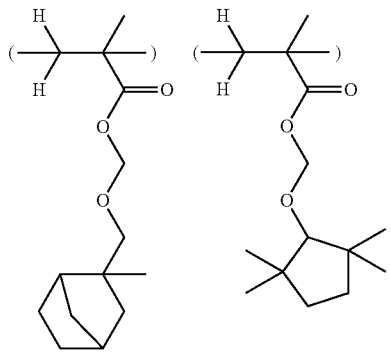
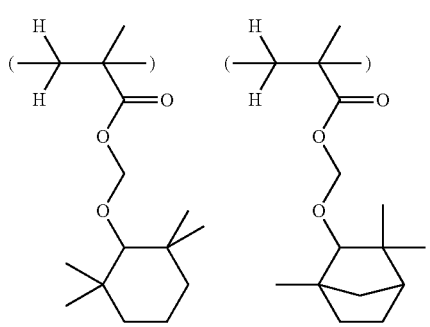
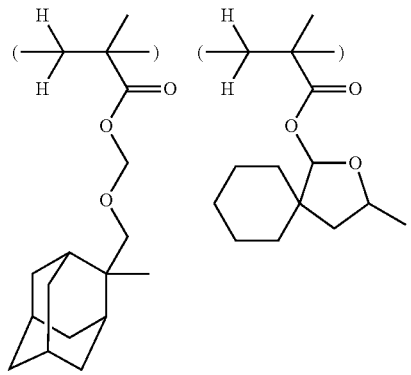
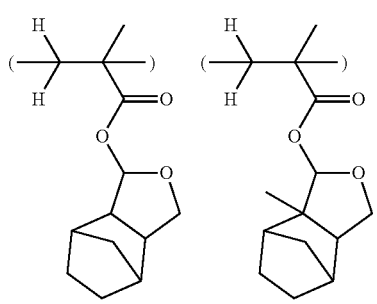
Examples of the recurring units having formula (2) are given below, but not limited thereto.

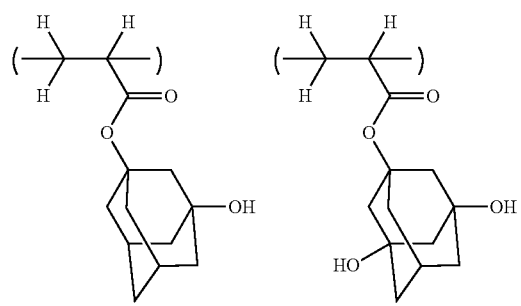
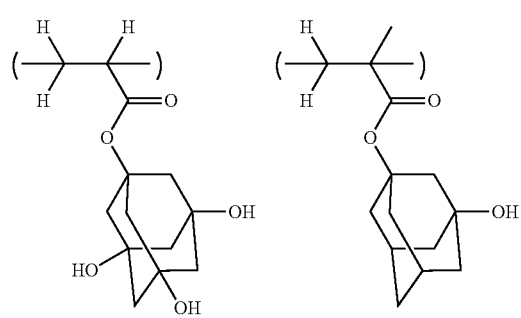
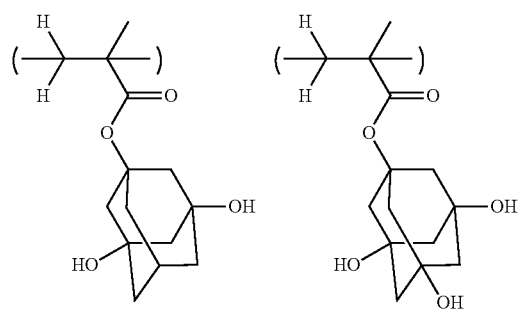
Examples of the recurring units having formula (3) are given below, but not limited thereto.
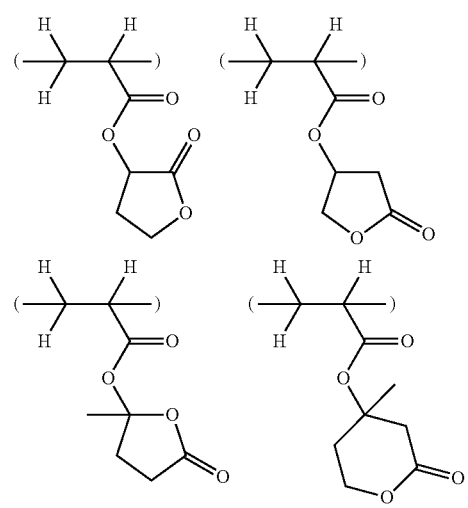
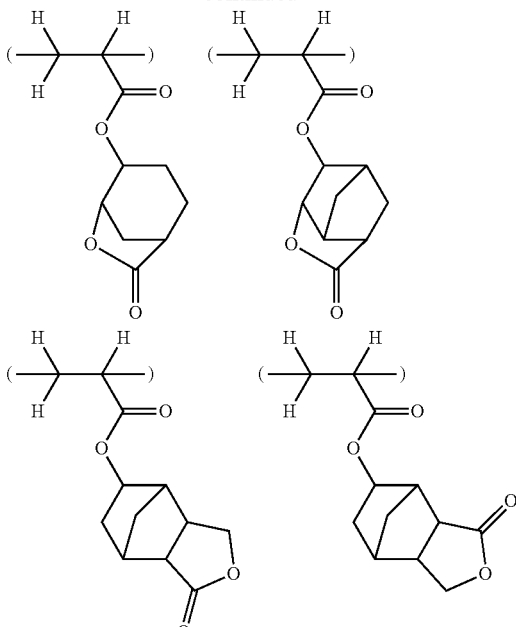
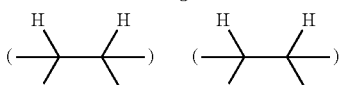
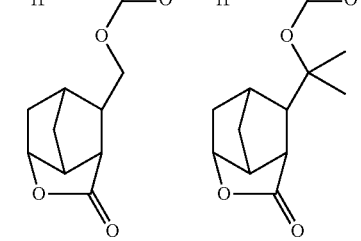
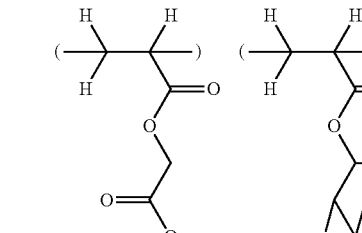
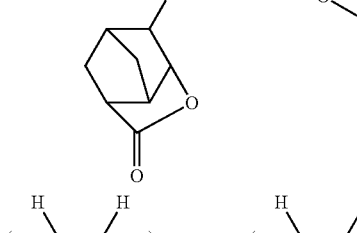
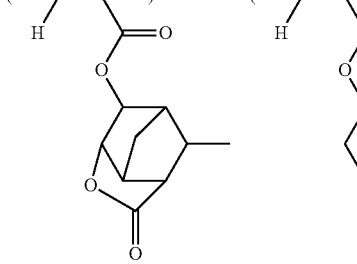

-continued
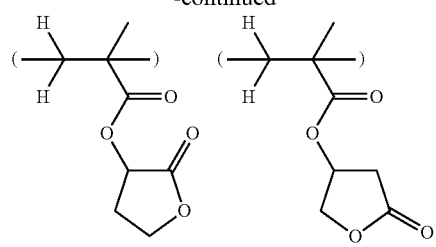
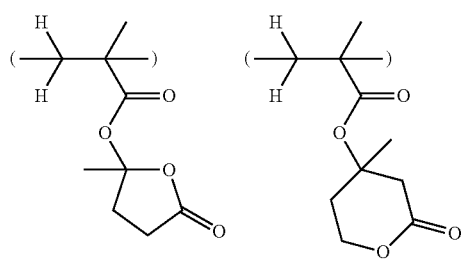
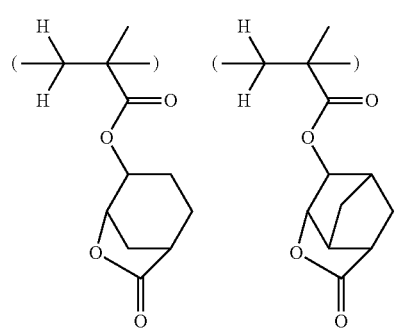
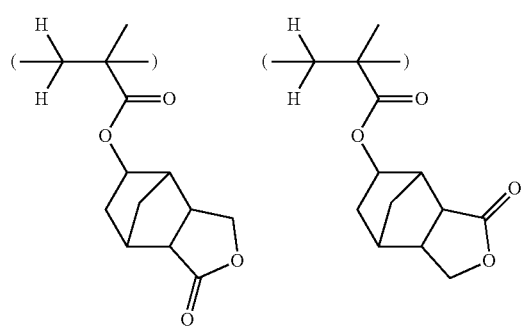
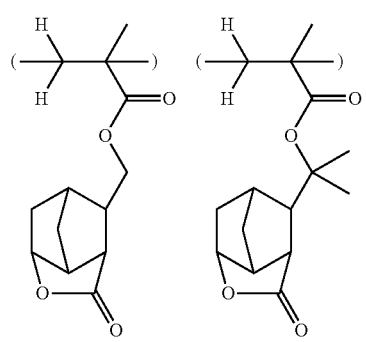
-continued
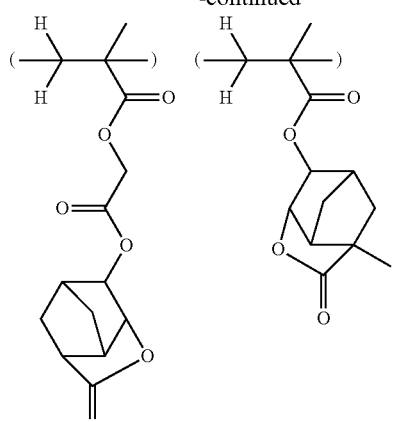
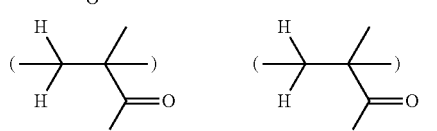
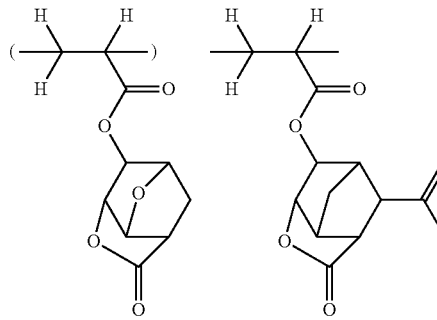
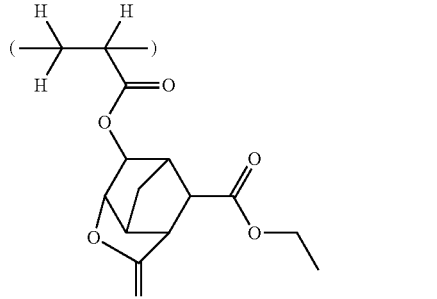
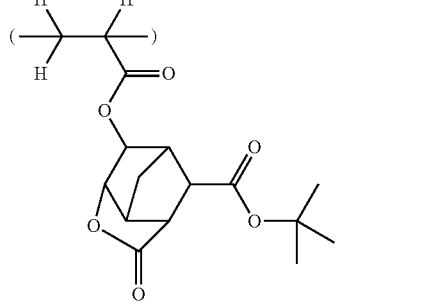

-continued
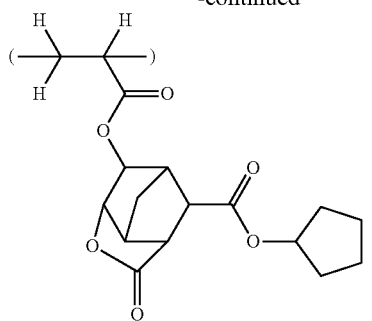
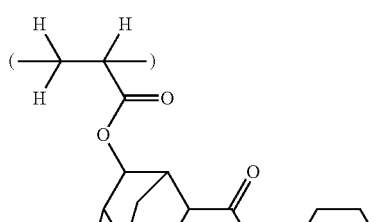
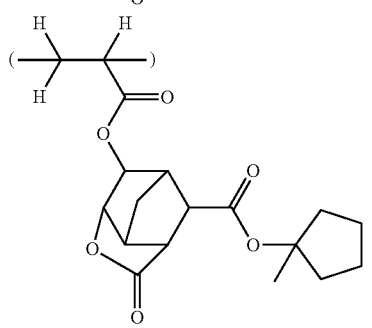
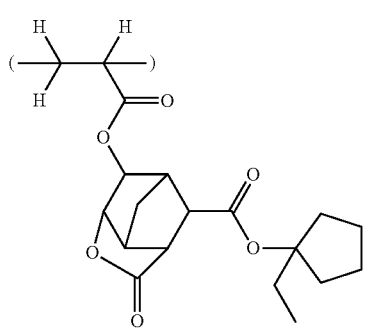
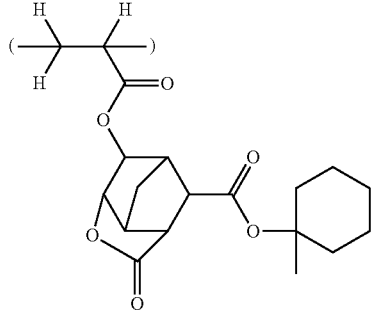
-continued
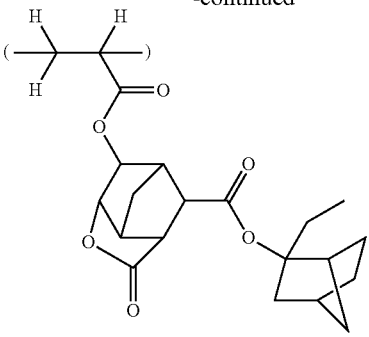
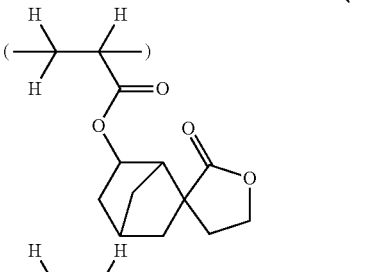
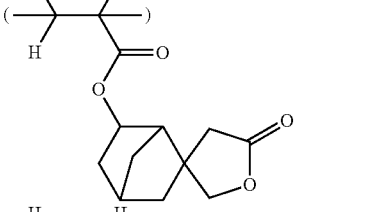
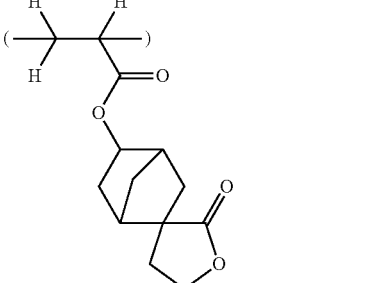
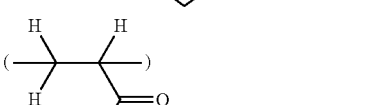
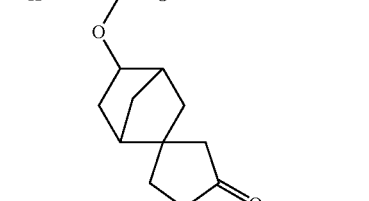
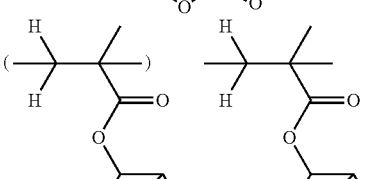
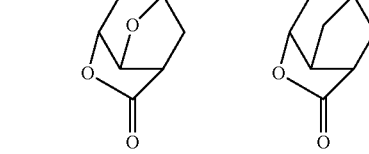

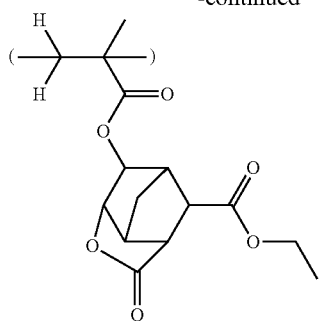
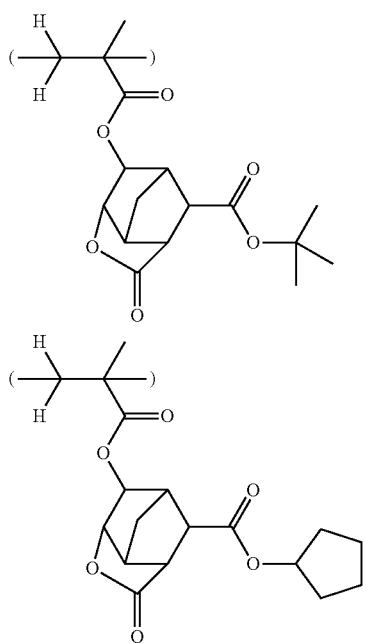
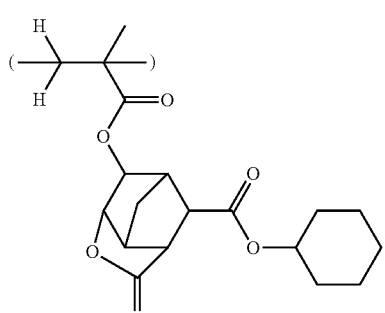
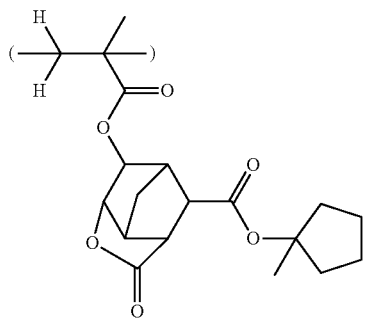
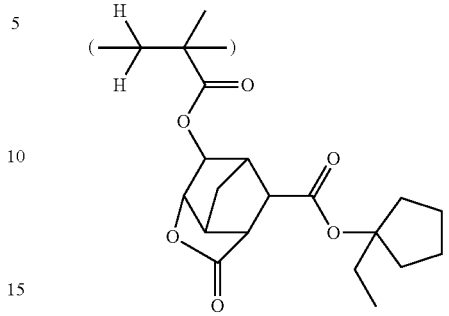
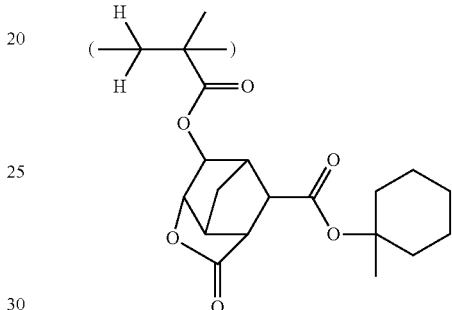
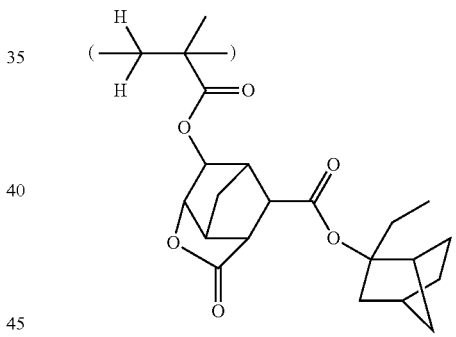
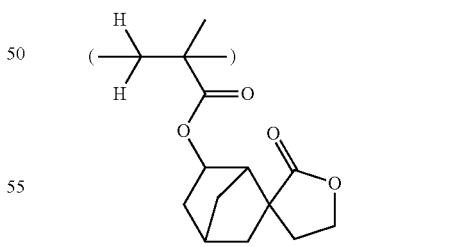
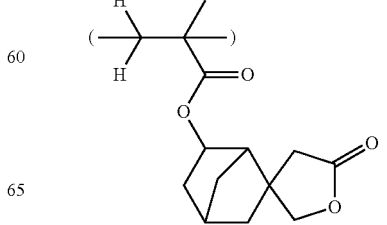

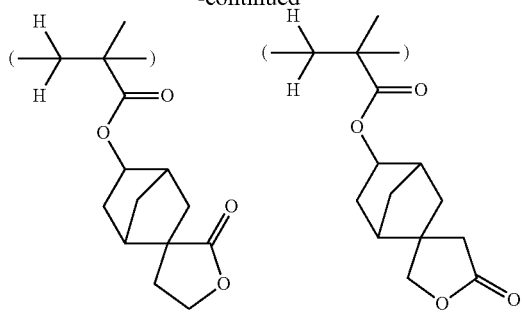
Examples of the recurring units having formula (4) are given below, but not limited thereto.
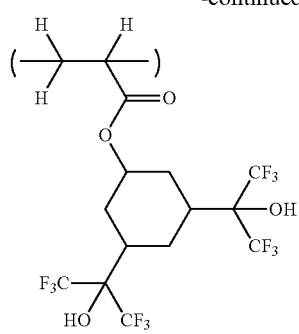
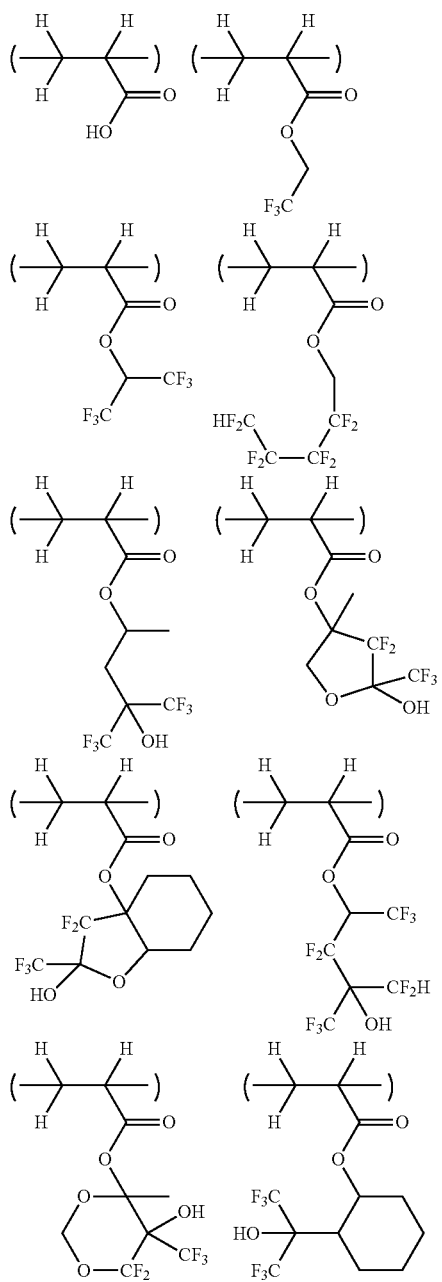
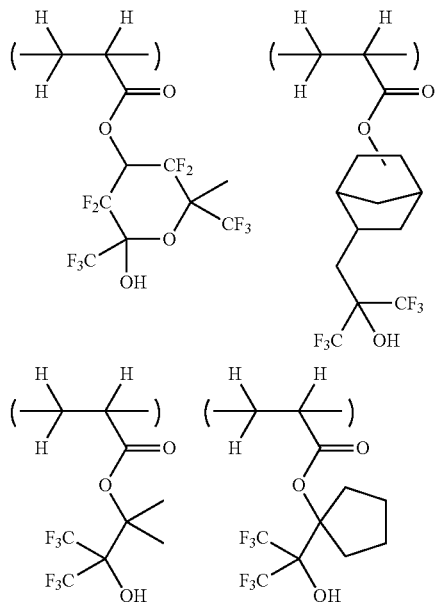
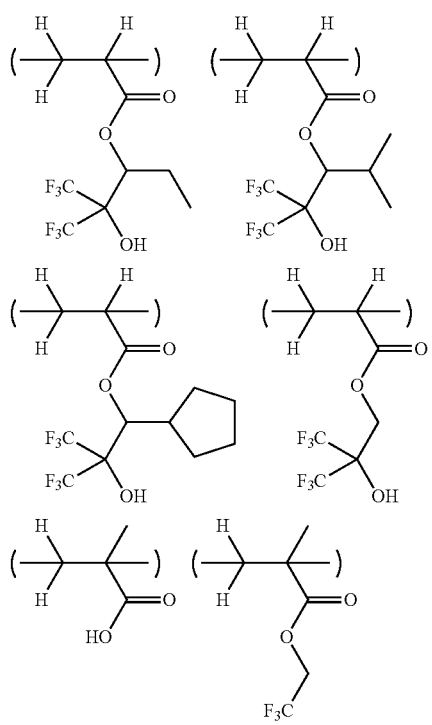

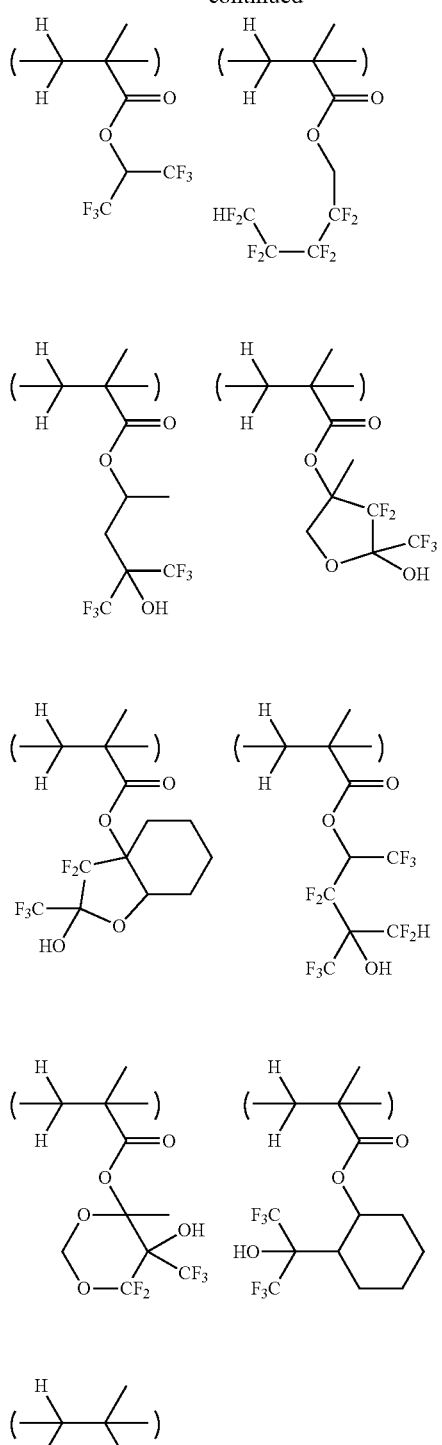
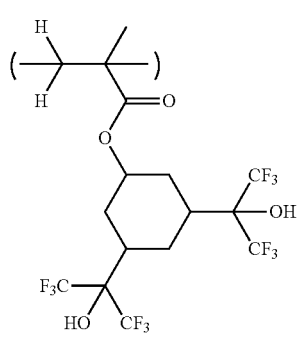
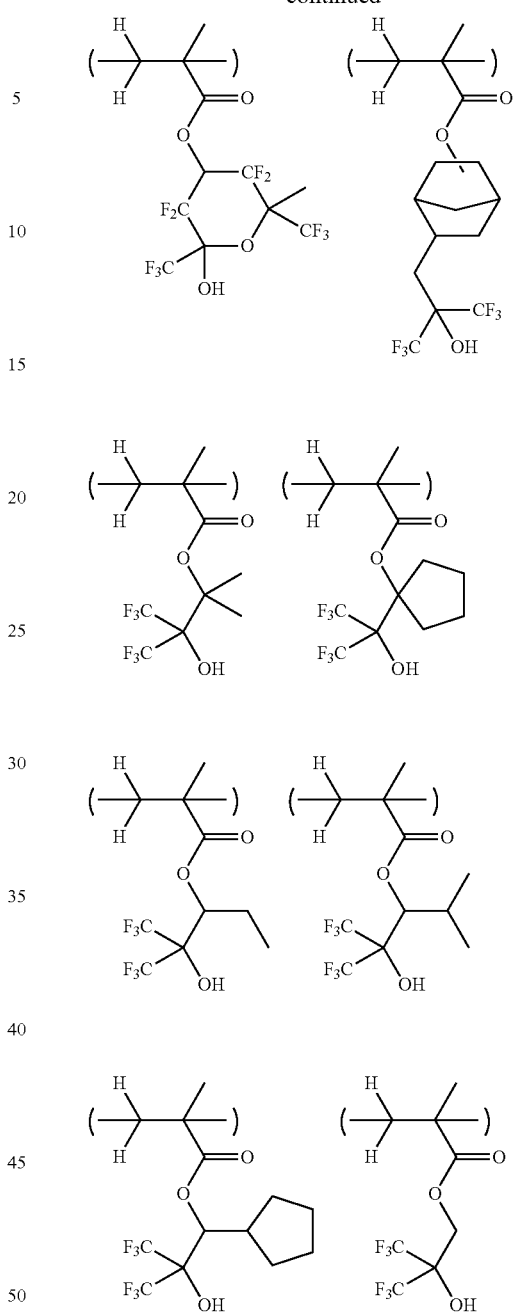

In addition to the foregoing units, the polymer used herein as the resin component may further comprise recurring units derived from other monomers having a carbon-carbon double bond, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo [6.2.1.1$^{3,6}$.0$^{2,7}$]dodecene derivatives, and unsaturated acid anhydrides such as itaconic anhydride.

Specifically the polymer used herein may comprise recurring units of one or more type selected from the general formulae (5) to (8) as well as recurring units of one or more type selected from the general formulae (1) to (4).

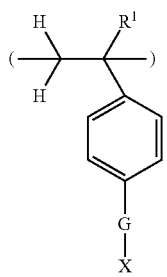
(5)

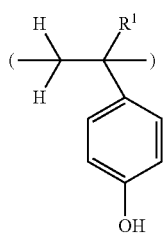
(6)

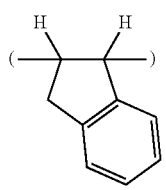
(7)

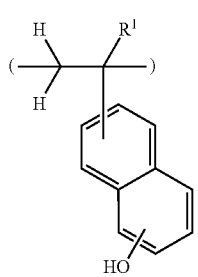
(8)

Herein R¹ and X are as defined above, and G is an oxygen atom or carbonyloxy group (—C(=O)O—).

A polymer comprising recurring units of formula (5) is decomposed under the action of an acid to generate a phenolic hydroxyl group and/or carboxylic acid so that the polymer may become alkali soluble. The acid labile group X may be selected from a variety of such groups. Examples of the acid labile group are groups of formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms, as illustrated above.

Examples of the recurring units having formula (5) are given below, but not limited thereto.

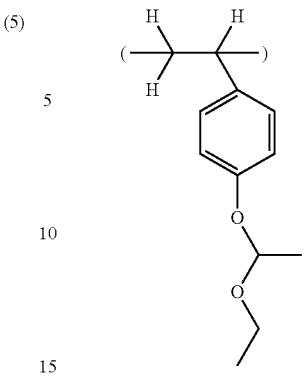
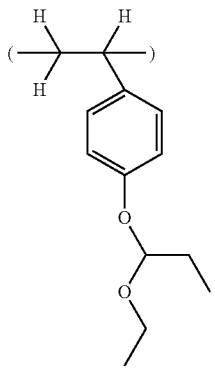

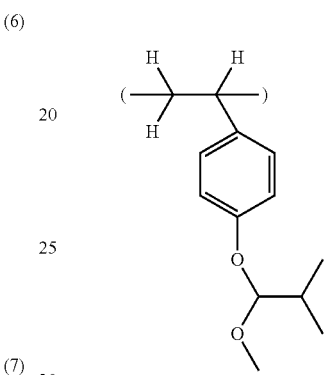
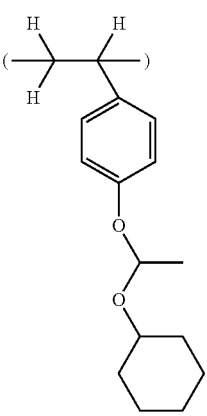

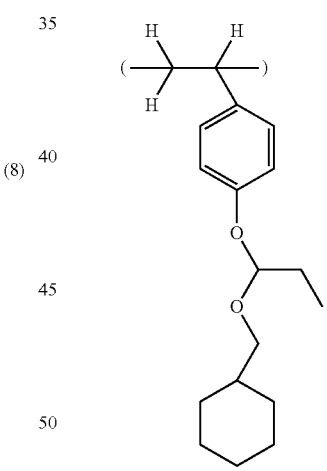
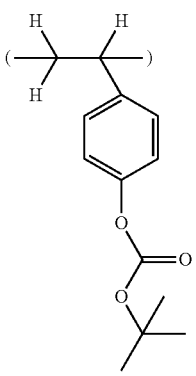

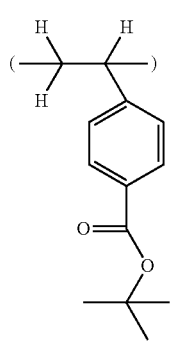
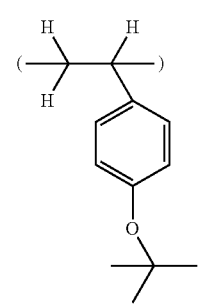

-continued

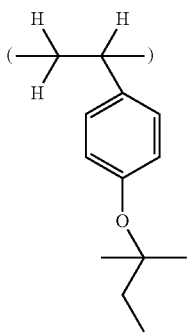
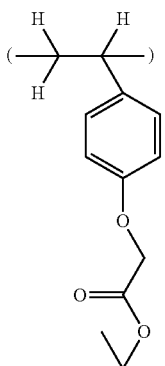

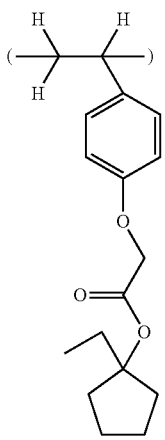
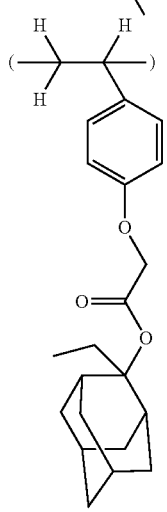

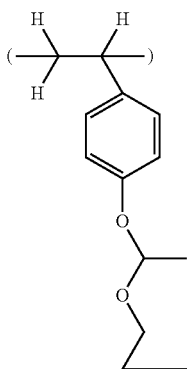

The hydroxyvinylnaphthalene in formula (8) may take any substitution position and encompasses 6-hydroxy-2-vinylnaphthalene, 4-hydroxy-1-vinylnaphthalene, and the like, with 6-hydroxy-2-vinylnaphthalene being preferred.

More preferred is a polymer comprising recurring units of one or more type selected from the general formulae (5) to (8) and recurring units of formula (1) among units of the general formulae (1) to (4).

The polymer comprising recurring units of one or more type selected from the general formulae (5) to (8) may further comprise recurring units derived from monomers having a carbon-carbon double bond other than the above-described ones, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, tetracyclo [6.2.1.1$^{3,6}$.0$^{2,7}$]dodecene derivatives, and norbornadiene derivatives, unsaturated acid anhydrides such as itaconic anhydride, styrene, acenaphthylene, vinylnaphthalene and other monomers.

Another polymer may also be used as the resin component. Examples of the other polymer include, but are not limited to, (i) poly(meth)acrylic acid derivatives, (ii) norbornene derivative/maleic anhydride copolymers, (iii) hydrogenated products of ring-opening metathesis polymerization (ROMP) polymers, (iv) vinyl ether/maleic anhydride/(meth)acrylic acid derivative copolymers, and (v) polyhydroxystyrene derivatives. Of these, the poly(meth)acrylic acid derivatives (i) are polymers based on a combination of formulae (1) to (4); and the polyhydroxystyrene derivatives (v) are polymers based on a combination of formulae (5) to (8) and a combination of formulae (1) to (8). In these polymers, those units having an acid labile group, for example, monomeric units of one or more type of formula (1) and/or (5) are present in a proportion of more than 0 mol % to 80 mol %, preferably 1 to 50 mol %, and more preferably 10 to 40 mol %.

The hydrogenated ROMP polymers are synthesized by the method illustrated in JP-A 2003-66612. Illustrative examples of such hydrogenated polymers include those polymers having the recurring units shown below, but are not limited thereto.

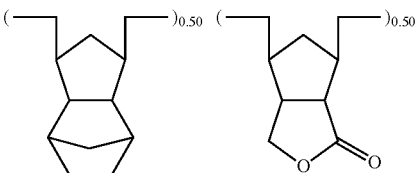

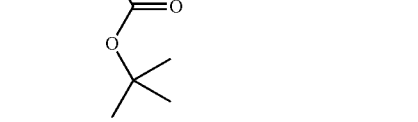

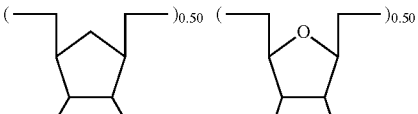

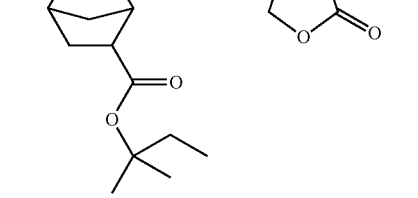

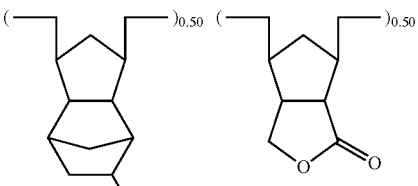

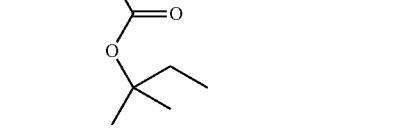

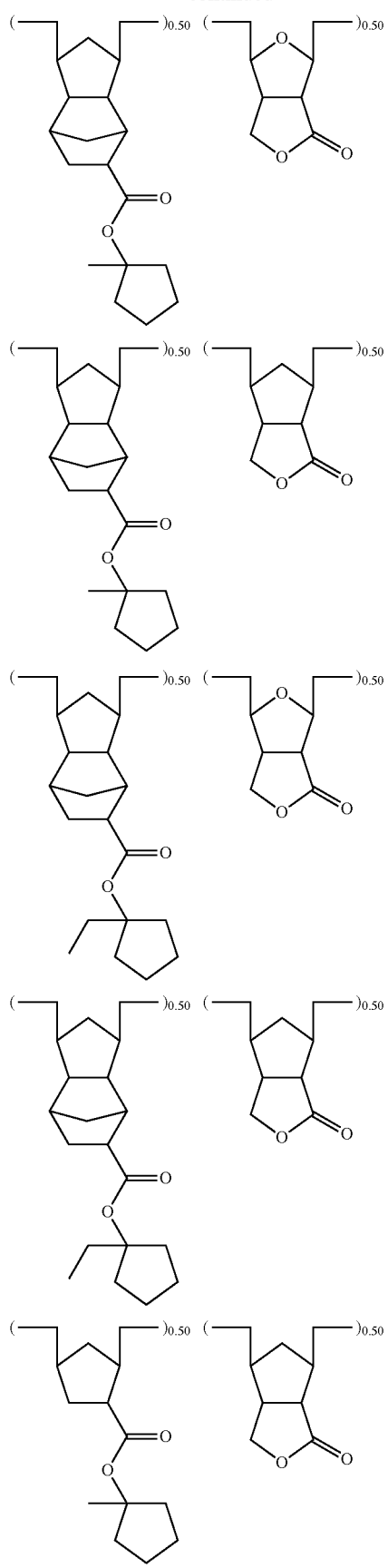
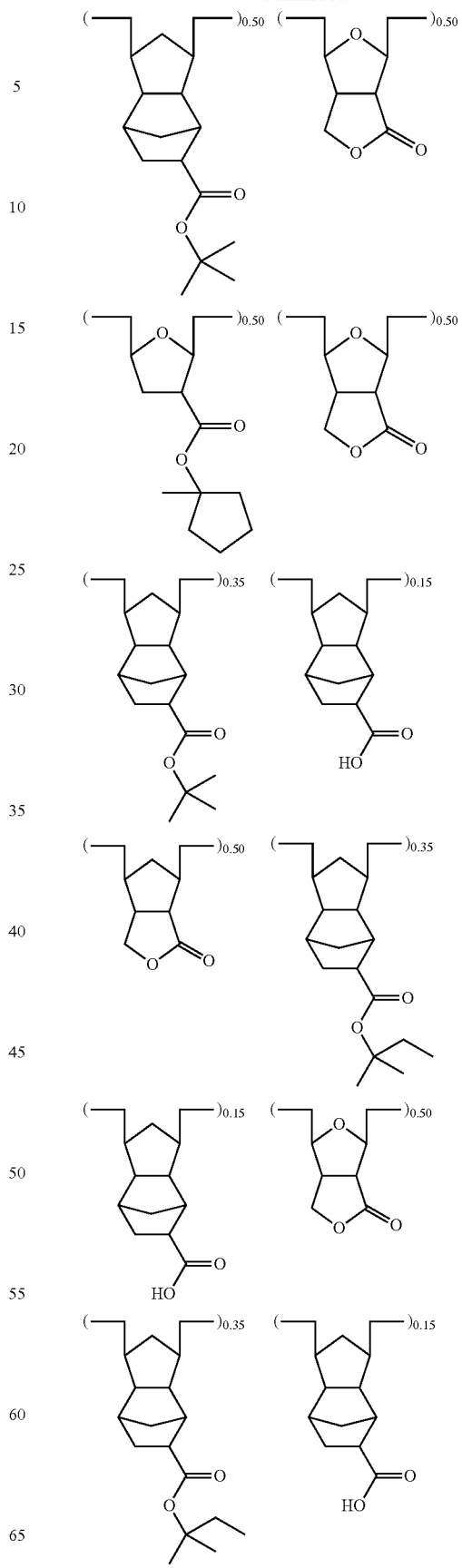

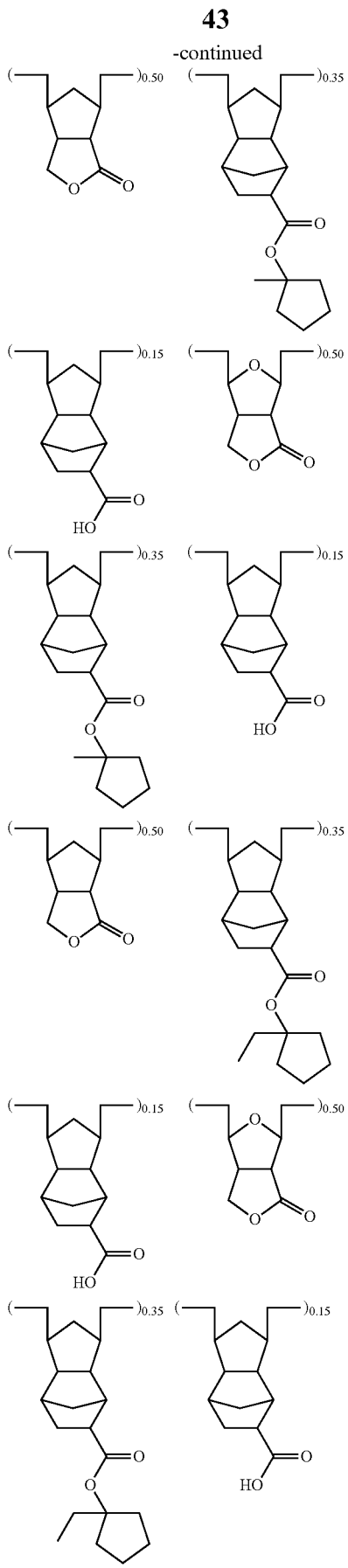
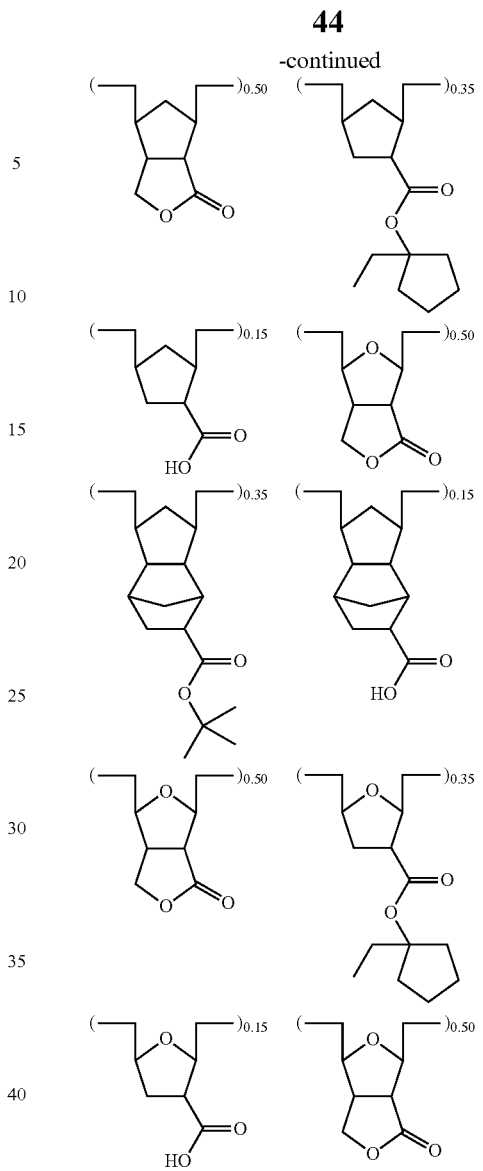

The polymer used herein generally has a weight average molecular weight (Mw) of 1,000 to 500,000, and preferably 3,000 to 100,000, as measured by gel permeation chromatography (GPC) or the light scattering method using polystyrene standards. Outside the range, there may result an extreme drop of etch resistance, and a drop of resolution due to difficulty to gain a dissolution rate difference before and after exposure.

In the polymer, appropriate proportions of the respective recurring units derived from the monomers are given below although the invention is not limited thereto. The polymer may contain (I) constituent units of formulae (1) to (4) and/or formulae (5) to (8), specifically from more than 0 mol % to less than 100 mol %, preferably 1 mol % to 60 mol %, and more preferably 10 mol % to 40 mol % of constituent units of formula (1) and from 0 mol % to less than 100 mol %, preferably 40 mol % to 99 mol %, and more preferably 60 mol % to 90 mol % of one or more of the remaining constituent units, and optionally (II) from 0 mol % to 80 mol %, preferably 0 mol % to 70 mol %, and more preferably 0 mol % to 50 mol % of one or more of constituent units derived from other monomers.

It is noted that the polymer used herein as the resin component is sometimes referred to as "inventive polymer."

PAG

An acid generator is used herein. When a photoacid generator (PAG) is added as the acid generator, it may be any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. They may be used alone or in admixture of two or more. Exemplary acid generators are described in U.S. Pat. No. 7,537,880 or JP-A 2008-111103, paragraph [0027] to [0028], and US 2009274978 or JP-A 2009-269953, paragraphs [0029] to [0030] and [0031] to [0032].

When the PAG is added to KrF excimer laser resist compositions, preference is given to sulfonium salts, bissulfonyldiazomethanes, N-sulfonyloxyimides and oxime-O-sulfonates. Examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(p-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(p-toluenesulfonyl-oxy)benzenesulfonate, 4-tert-butylphenyldiphenylsulfonium camphorsulfonate, tris(4-methylphenyl)sulfonium camphorsulfonate, tris(4-tert-butylphenyl)sulfonium camphorsulfonate, bis(tert-butylsulfonyl)diazomethane, bis(cyclohexylsulfonyl)diazomethane, bis(2,4-dimethylphenylsulfonyl)diazomethane, bis(4-n-hexyloxyphenylsulfonyl)diazomethane, bis(2-methyl-4-n-hexyloxyphenylsulfonyl)diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxy)phenylsulfonyl-diazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, (5-(10-camphorsulfonyl)oxyimino-5H-thiophen-2-ylidene)(2-methylphenyl)acetonitrile, and (5-(p-toluenesulfonyl)oxyimino-5H-thiophen-2-ylidene)(2-methylphenyl)acetonitrile.

When the PAG is added to ArF laser resist compositions and ArF immersion lithography resist compositions, preference is given to sulfonium salts and oxime-O-sulfonates. More preferred are photoacid generators capable of generating fluorinated sulfonic acid.

Among others, acid generators having the general formula (E-1) are preferred.

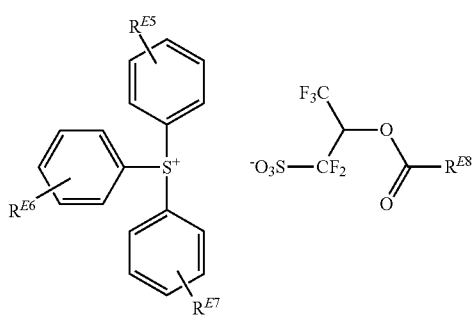

(E-1)

Herein $R^{E5}$, $R^{E6}$, and $R^{E7}$ are each independently hydrogen or a straight, branched or cyclic, monovalent $C_1$-$C_{20}$ hydrocarbon group which may contain a heteroatom. Examples of hydrocarbon groups optionally containing a heteroatom include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl, and modified forms of the foregoing in which any carbon-carbon bond is separated by a hetero-atomic grouping such as —O—, —S—, —SO—, —SO$_2$—, —NH—, —C(=O)—, —C(=O)O—, or —C(=O)NH—, or any hydrogen atom is replaced by a functional group such as —OH, —NH, —CHO, or —CO$_2$H. $R^{E8}$ is a straight, branched or cyclic, monovalent $C_7$-$C_{30}$ hydrocarbon group which may contain a heteroatom, examples of which are exemplified below, but are not limited thereto.

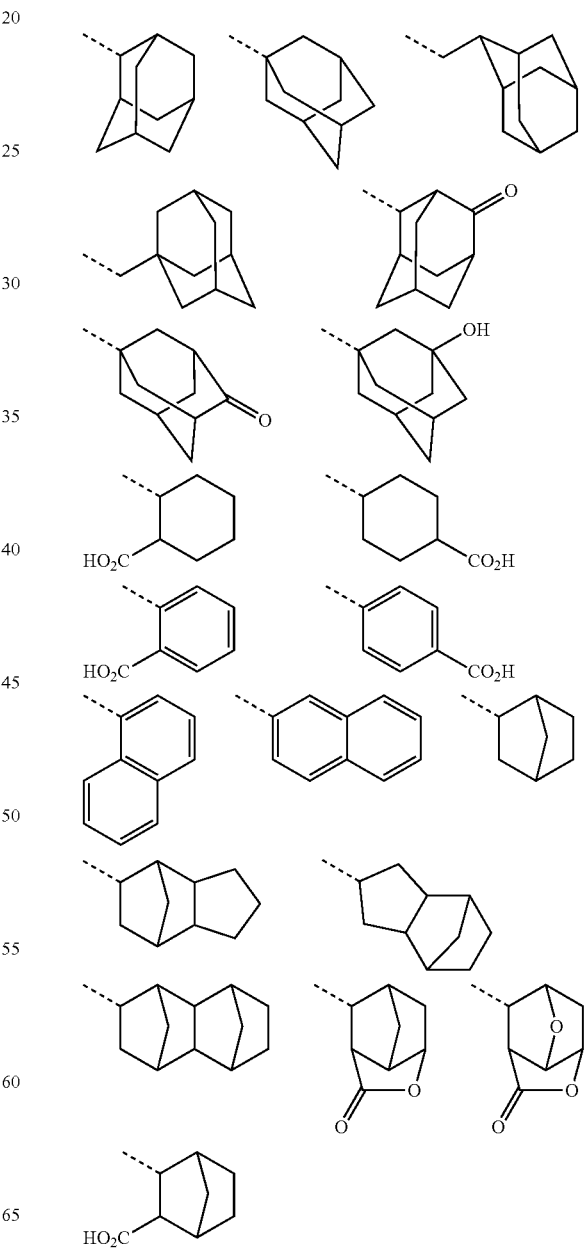

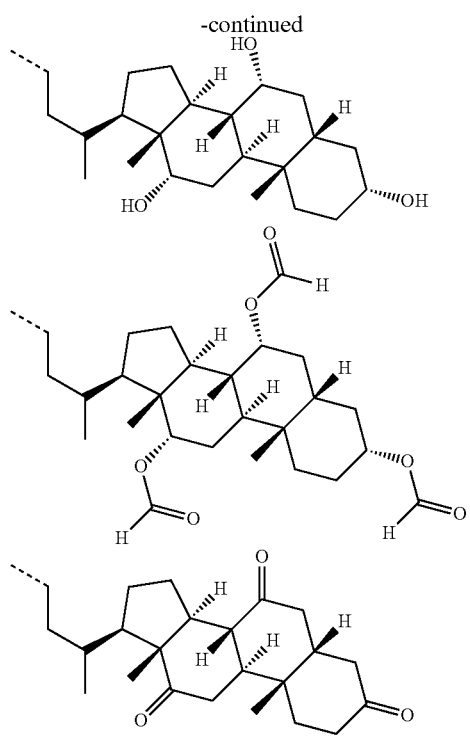

In the chemically amplified resist composition, the PAG may be added in any desired amount as long as the objects of the invention are not compromised. An appropriate amount of the PAG is 0.1 to 20 parts, and more preferably 0.1 to 15 parts by weight per 100 parts by weight of the base resin in the composition. For the resist composition adapted to form a film having a thickness of no more than 150 nm, an appropriate amount of the PAG is 2 to 15 phr. Too high a proportion of the PAG may give rise to problems of degraded resolution and foreign matter upon development and resist film stripping. The PAGs may be used alone or in admixture of two or more. The transmittance of the resist film can be controlled by using a PAG having a low transmittance at the exposure wavelength and adjusting the amount of the PAG added.

It is noted that an acid diffusion controlling function may be provided when two or more PAGs are used in admixture provided that one PAG is an onium salt capable of generating a weak acid. Specifically, in a system using a mixture of a PAG capable of generating a strong acid (e.g., fluorinated sulfonic acid) and an onium salt capable of generating a weak acid (e.g., non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If an onium salt capable of generating a strong acid and an onium salt capable of generating a weak acid are used in admixture, an exchange from strong acid to weak acid as above can take place, but it never happens that the weak acid collides with the unreacted onium salt capable of generating a strong acid to induce a salt exchange. This is because of a likelihood of an onium cation forming an ion pair with a stronger acid anion.

In the resist composition of the invention, there may be added a compound which is decomposed with an acid to generate another acid, that is, acid amplifier compound. For these compounds, reference should be made to J. Photopolym. Sci. and Tech., 8, 43-44, 45-46 (1995), and ibid., 9, 29-30 (1996).

Examples of the acid amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Most often an organic solvent is added to the resist composition. The organic solvent used herein may be any organic solvent in which the base resin, acid generator, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, PGMEA, and mixtures thereof because the acid generator is most soluble therein.

An appropriate amount of the organic solvent used is 200 to 1,000 parts, especially 400 to 800 parts by weight per 100 parts by weight of the base resin so that the resist solution may be diluted to form a thin film in accordance with the desired degree of miniaturization or reduced size of a pattern to be formed.

In the resist composition, one or more quencher may be compounded. The term "quencher" is commonly used in the art as meaning a compound capable of suppressing the rate of diffusion when the acid generated by the acid generator diffuses within the resist film. The inclusion of quencher facilitates to adjust the resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile.

Suitable quenchers include primary, secondary, and tertiary aliphatic amines, mixed amines, aromatic amines, heterocyclic amines, carboxylic acid amides, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the carboxylic acid amide include acetamide, acrylamide, molonamide, succinamide, maleamide, fumaramide, benzamide, 1-naphthamide, 2-naphthamide, phthalamide, isophthalamide, terephthalamide, 2-furamide, formamide, propionamide, propiolamide, butyramide, isobutylamide, methacrylamide, lauric amide, oleic amide, erucic amide, palmitamide (palmitic amide), stearamide (stearic amide), oleamide, oxamide, glutaramide, adipamide, cinnamamide, glycolamide, lactamide, glyceramide, tartaramide, citramide, glyoxylamide, pyruvic amide, acetoacetamide, benzylamide, anthranylamide, ethylene diamine tetraacetamide, diacetamide, and dibenzamide.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). One suitable nitrogen-containing compound with sulfonyl group is 3-pyridinesulfonic acid. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-tert-butoxycarbonyl-N,N-dicyclohexylamine, N-tert-butoxycarbonylbenzimidazole, and oxazolidinone.

Suitable ammonium salts include pyridinium p-toluenesulfonate, triethylammonium p-toluenesulfonate, trioctylammonium p-toluenesulfonate, triethylammonium 2,4,6-triisopropylbenzenesulfonate, trioctylammonium 2,4,6-triisopropylbenzenesulfonate, triethylammonium camphorsulfonate, trioctylammonium camphorsulfonate, tetramethylammonium hydroxide, tetraethylammonium hydroxide, tetrabutylammonium hydroxide, benzyltrimethylammonium hydroxide, tetramethylammonium p-toluenesulfonate, tetrabutylammonium p-toluenesulfonate, benzyltrimethylammonium p-toluenesulfonate, tetramethylammonium camphorsulfonate, tetrabutylammonium camphorsulfonate, benzyltrimethylammonium camphorsulfonate, tetramethylammonium 2,4,6-triisopropylbenzenesulfonate, tetrabutylammonium 2,4,6-triisopropylbenzenesulfonate, benzyltrimethylammonium 2,4,6-triisopropylbenzenesulfonate, tetramethylammonium acetate, tetrabutylammonium acetate, benzyltrimethylammonium acetate, tetramethylammonium benzoate, tetrabutylammonium benzoate, and benzyltrimethylammonium benzoate.

In addition, amine compounds of the following general formula (B)-1 may also be included alone or in admixture.

$$N(X)_n(Y)_{3-n} \qquad \text{(B)-1}$$

In the formula, n is equal to 1, 2 or 3. X is independently selected from groups of the following general formulas (X)-1 to (X)-3. Y is independently hydrogen or a straight, branched or cyclic $C_1$-$C_{20}$ alkyl group in which some or all hydrogen atoms may be substituted by fluorine atoms and which may contain an ether or hydroxyl group. Two or three X may bond together to form a ring.

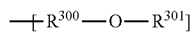 (X)-1

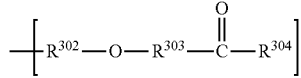 (X)-2

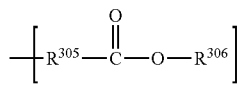 (X)-3

In the formulas, $R^{300}$, $R^{302}$ and $R^{305}$ are independently straight or branched $C_1$-$C_4$ alkylene groups. $R^{301}$ and $R^{304}$ are independently hydrogen or straight, branched or cyclic $C_1$-$C_{20}$ alkyl groups in which some or all hydrogen atoms may be substituted by fluorine atoms and which may contain at least one hydroxyl group, ether group, ester group or lactone ring. $R^{303}$ is a single bond or a straight or branched $C_1$-$C_4$ alkylene group. $R^{306}$ is a straight, branched or cyclic $C_1$-$C_{20}$ alkyl group in which some or all hydrogen atoms may be substituted by fluorine atoms and which may contain at least one hydroxyl group, ether group, ester group or lactone ring.

Illustrative examples of the compounds of formula (B)-1 include, but are not limited to, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-1(2-oxotetrahydrofuran-3-yl)oxy-carbonyl)ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone.

Also useful are one or more of cyclic structure-bearing amine compounds having the following general formula (B)-2.

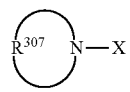 (B)-2

Herein X is as defined above, and $R^{307}$ is a straight or branched $C_2$-$C_{20}$ alkylene group in which some or all hydrogen atoms may be substituted by fluorine atoms and which may contain one or more carbonyl, ether, ester or sulfide groups.

Illustrative examples of the cyclic structure-bearing amine compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-[2-(2-methoxyethoxy)ethoxy]ethylmorpholine, 2-[2-(2-butoxyethoxy)ethoxy]ethylmorpholine, 2-[2-[2-(2-methoxyethoxy)ethoxy]ethoxy]ethylmorpholine, 2-[2-[2-(2-butoxyethoxy)ethoxy]ethoxy]ethylmorpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl cyclohexanecarboxylate, and 2-morpholinoethyl adamantanecarboxylate.

Also, one or more of cyano-bearing amine compounds having the following general formulae (B)-3 to (B)-6 may be added.

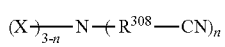

(B)-3

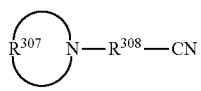

(B)-4

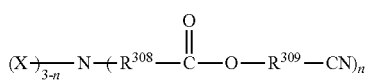

(B)-5

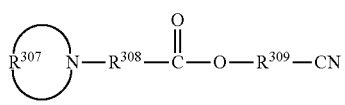

(B)-6

Herein, X, $R^{307}$ and n are as defined above, and $R^{308}$ and $R^{309}$ are each independently a straight or branched $C_1$-$C_4$ alkylene group.

Illustrative examples of the cyano-bearing amine compounds having formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiono-nitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl)aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-amino-propionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are amine compounds of imidazole structure having a polar functional group, represented by the general formula (B)-7.

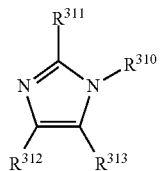

(B)-7

Herein, $R^{310}$ is a straight, branched or cyclic $C_2$-$C_{20}$ alkyl group in which some or all hydrogen atoms may be substituted by fluorine atoms and which has one or more polar functional groups. The polar functional group is selected from among hydroxyl, carbonyl, ester, ether, sulfide, carbonate, cyano and acetal groups and mixtures thereof. $R^{311}$, $R^{312}$ and $R^{313}$ are each independently a hydrogen atom, a straight, branched or cyclic $C_1$-$C_{10}$ alkyl group, aryl group or aralkyl group.

Also included are amine compounds of benzimidazole structure having a polar functional group, represented by the general formula (B)-8.

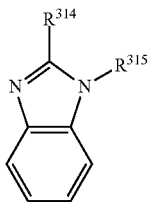
(B)-8

Herein, $R^{314}$ is hydrogen, a straight, branched or cyclic $C_1$-$C_{10}$ alkyl group, aryl group or aralkyl group. $R^{315}$ is a straight, branched or cyclic $C_1$-$C_{20}$ alkyl group in which some or all hydrogen atoms may be substituted by fluorine atoms and which has one or more polar functional groups. The alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

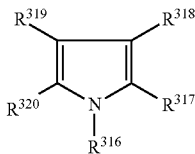
(B)-9

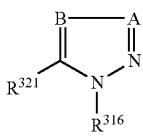
(B)-10

Herein, A is a nitrogen atom or $=$C—$R^{322}$. B is a nitrogen atom or $=$C—$R^{323}$. $R^{316}$ is a straight, branched or cyclic $C_2$-$C_{20}$ alkyl group in which some or all hydrogen atoms may be substituted by fluorine atoms and which has one or more polar functional groups, the polar functional group being selected from among hydroxyl, carbonyl, ester, ether, sulfide, carbonate, cyano and acetal groups and mixtures thereof. $R^{317}$, $R^{318}$, $R^{319}$ and $R^{320}$ are each independently hydrogen, a straight, branched or cyclic $C_1$-$C_{10}$ alkyl group or aryl group, or a pair of $R^{317}$ and $R^{318}$ and a pair of $R^{319}$ and $R^{320}$ may bond together to form a benzene, naphthalene or pyridine ring with the carbon atom to which they are attached. $R^{321}$ is hydrogen, a straight, branched or cyclic $C_1$-$C_{10}$ alkyl group or aryl group. $R^{322}$ and $R^{323}$ each are hydrogen, a straight, branched or cyclic $C_1$-$C_{10}$ alkyl group or aryl group. $R^{321}$ and $R^{323}$ may bond together to form a benzene or naphthalene ring with the carbon atom to which they are attached.

Also included are nitrogen-containing compounds having an aromatic carboxylic acid ester structure, represented by the general formulae (B)-11 to (B)-14.

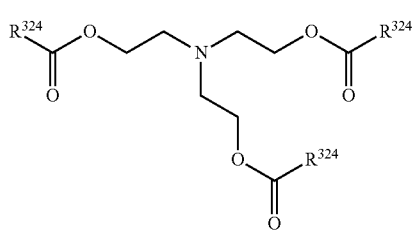
(B)-11

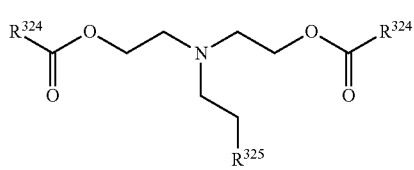
(B)-12

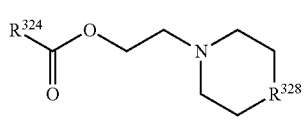
(B)-13

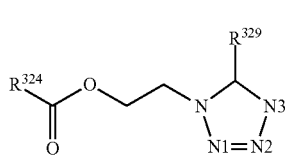
(B)-14

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is —$CO_2R^{326}$, —$OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —$O(CH_2CH_2O)_n$— group wherein n is 0, 1, 2, 3 or 4. $R^{329}$ is hydrogen, methyl, ethyl or phenyl. N1 is a nitrogen atom or $CR^{330}$. N2 is a nitrogen atom or $CR^{331}$. N3 is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring with the carbon atom to which they are attached.

Further included are amine compounds of 7-oxanorbornane-2-carboxylic ester structure, represented by the general formula (B)-15.

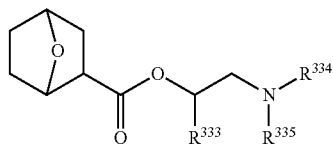
(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$ may bond together to form a heterocyclic or heteroaromatic ring of 2 to 20 carbon atoms with the nitrogen atom to which they are attached.

The quencher is preferably incorporated in an amount of 0.001 to 2 parts, and especially 0.01 to 1 part by weight, per 100 parts by weight of the base resin. Less than 0.001 phr of the quencher may achieve no addition effect whereas more than 2 phr may lead to too low a sensitivity.

In the resist composition, a surfactant commonly used for improving coating characteristics may be added as an optional component. It is noted that optional components such as surfactants may be added in ordinary amounts as long as they do not compromise the object of the invention.

Illustrative, non-limiting examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (JEMCO Inc.), Megaface F171, F172, F173, R08, and R30 (DIC Corp.), Fluorad FC-430, FC-431, FC-4430 and FC-4432 (Sumitomo 3M Co., Ltd.), Asahiguard AG710, Surflon S-381, S-382, S-386, SC101, SC102, SC103, SC104, SC105, SC106, KH-10, KH-20, KH-30 and KH-40 (Asahi Glass Co., Ltd.), and Surfynol E1004 (Nissin Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-430, Surflon S-381, Surfynol E1004, KH-20, and KH-30 are preferred. These surfactants may be used alone or in admixture.

In the resist composition, the surfactant is preferably compounded in an amount of up to 2 parts, and especially up to 1 part by weight, per 100 parts by weight of the base resin.

In one embodiment of the invention wherein the resist composition is worked by immersion lithography using water, especially in the absence of a resist protective coating, a surfactant may be added to the resist composition, the surfactant having a function to segregate at the resist surface after spin coating to prevent or reduce water penetration or leaching. This surfactant is a polymeric surfactant which is insoluble in water and soluble in an alkaline developer, and preferably improves water repellency and water slippage. Exemplary polymeric surfactants are those comprising monomeric units represented by the following formula.

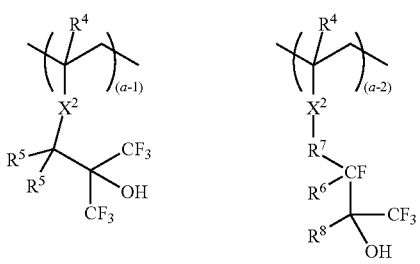

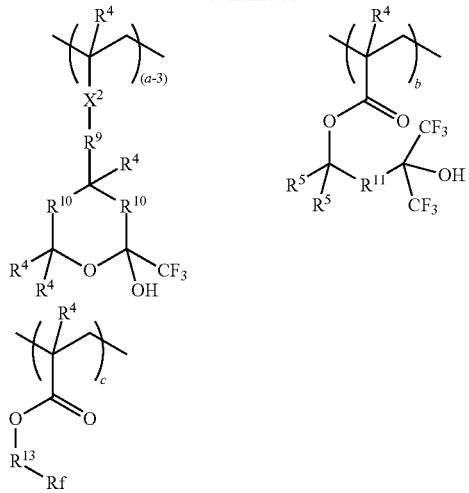

In the above formulae, $R^4$ is each independently hydrogen, fluorine, methyl or trifluoromethyl; $R^5$ is each independently hydrogen or a straight, branched or cyclic $C_1$-$C_{20}$ alkyl or fluoroalkyl group, or plural $R^{15}$ in a common unit may bond together to form a ring with the carbon atom to which they are attached, and in this case, they collectively stand for a straight, branched or cyclic alkylene or fluoroalkylene group having 2 to 20 carbon atoms in total. $R^6$ is fluorine or hydrogen, or $R^6$ may bond with $R^7$ to form a ring, typically aliphatic ring, having 3 to 10 carbon atoms in total with the carbon atom to which they are attached. $R^7$ is a straight, branched or cyclic $C_1$-$C_6$ alkylene group in which one or more hydrogen atoms may be replaced by fluorine atoms. $R^8$ is a straight or branched $C_1$-$C_{10}$ alkyl group in which one or more hydrogen atoms are replaced by fluorine atoms, or $R^7$ and $R^8$ may bond together to form a ring with the carbon atoms to which they are attached, and in this case, they collectively stand for a trivalent organic group having 2 to 12 carbon atoms in total, typically an alkylene group with one hydrogen being eliminated, in which one or more hydrogen may be replaced by fluorine. $R^9$ is a single bond or a $C_1$-$C_4$ alkylene group. $R^{10}$ is each independently a single bond, —O— or —CR$^4$R$^4$— wherein $R^4$ is as defined above. $R^{11}$ is a straight or branched $C_1$-$C_4$ alkylene group, or $R^{11}$ may bond with $R^5$ within a common unit to form a ring, typically aliphatic ring, having 4 to 7 carbon atoms in total with the carbon atom to which they are attached. $R^{13}$ is 1,2-ethylene, 1,3-propylene or 1,4-butylene. Rf is a straight perfluoroalkyl group of 3 to 6 carbon atoms, or 3H-perfluoropropyl, 4H-perfluorobutyl, 5H-perfluoropentyl or 6H-perfluorohexyl. $X^2$ is each independently —C(=O)—O—, —O—, or —C(=O)—R$^{12}$—C(=O)—O— wherein $R^{12}$ is a straight, branched or cyclic $C_1$-$C_{10}$ alkylene group. The subscripts are numbers in the range: $0 \leq (a-1) < 1$, $0 \leq (a-2) < 1$, $0 \leq (a-3) < 1$, $0 < (a-1)+(a-2)+(a-3) < 1$, $0\ b < 1$, $0 \leq c < 1$, and $0 < (a-1)+(a-2)+(a-3)+b+c \leq 1$.

In the resist composition, the polymeric surfactant is preferably added in an amount of 0.001 to 20 parts, and more preferably 0.01 to 10 parts by weight, per 100 parts by weight of the base resin.

Besides the inventive polymer used as the base resin, an alkali-soluble resin may be added. Examples of the additional resin include poly(p-hydroxystyrene), poly(m-hydroxystyrene), poly(4-hydroxy-2-methylstyrene), poly(4-hydroxy-3-methylstyrene), poly(α-methyl-p-hydroxystyrene), partially hydrogenated p-hydroxystyrene copolymers, p-hydroxystyrene-α-methyl-p-hydroxystyrene copolymers, p-hydroxystyrene-α-methylstyrene copolymers, p-hydroxystyrene-styrene copolymers, p-hydroxystyrene-m-hydroxystyrene copolymers, p-hydroxystyrene-styrene copolymers, p-hydroxystyrene-acrylic acid copolymers, p-hydroxystyrene-methacrylic acid copolymers, p-hydroxystyrene-methyl methacrylate copolymers, p-hydroxystyrene-acrylic acid-methyl methacrylate copolymers, p-hydroxystyrene-methyl acrylate copolymers, p-hydroxystyrene-methacrylic acid-methyl methacrylate copolymers, poly(methacrylic acid), poly(acrylic acid), acrylic acid-methyl acrylate copolymers, methacrylic acid-methyl methacrylate copolymers, acrylic acid-maleimide copolymers, methacrylic acid-maleimide copolymers, p-hydroxystyrene-acrylic acid-maleimide copolymers, and p-hydroxystyrene-methacrylic acid-maleimide copolymers, but are not limited to these combinations.

The inventive polymer and the other alkali-soluble resin which are used as the base resin are preferably blended in a weight ratio in the range of from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

Notably, the alkali-soluble resin is not limited to one type and a mixture of two or more resins may be added. The use of plural resins allows for easy adjustment of resist properties.

To the resist composition, an acid crosslinker may be added which forms a crosslinked structure under the action of acid. Typical crosslinkers are compounds having at least two hydroxymethyl, alkoxymethyl, oxiranyl or vinyl ether groups within a molecule. Substituted glycoluril derivatives, urea derivatives, and hexa(methoxymethyl)melamine compounds are suitable as the acid crosslinker in the chemically amplified resist composition. Examples include N,N,N',N'-tetramethoxymethylurea, hexamethoxymethylmelamine, tetraalkoxymethyl-substituted glycoluril compounds such as tetrahydroxymethyl-substituted glycoluril and tetramethoxymethylglycoluril, and condensates of phenolic compounds such as substituted or unsubstituted bis(hydroxymethylphenol) compounds and bisphenol A with epichlorohydrin. Especially preferred crosslinkers are 1,3,5,7-tetraalkoxymethylglycolurils such as 1,3,5,7-tetramethoxymethylglycoluril, 1,3,5,7-tetrahydroxymethylglycoluril, 2,6-dihydroxymethyl-p-cresol, 2,6-dihydroxymethylphenol, 2,2',6,6'-tetrahydroxymethyl-bisphenol A, 1,4-bis[2-(2-hydroxypropyl)]benzene, N,N,N',N'-tetramethoxymethylurea, and hexamethoxymethylmelamine.

In the chemically amplified resist composition, an appropriate amount of the acid crosslinker is, though not limited thereto, 0.05 to 20 parts, and especially 0.05 to 5 parts by weight per 100 parts by weight of the base resin. The crosslinkers may be used alone or in admixture of two or more.

While the resist composition of the invention typically comprises a compound for activating or condensing a carboxyl group, specifically a carbodiimide or triazine base condensing agent, an additive, specifically an alcohol compound, thiol compound, primary or secondary amine, carboxylic acid amide, or nitrogen-containing compound having a carboxyl group, a polymer or base resin, acid generator, organic solvent and quencher as described above, there may be added optional other ingredients such as adjuvants capable of promoting reaction of the activating or condensing compound, dissolution inhibitors, surfactants, acidic compounds, stabilizers, and dyes. Optional ingredients may be added in conventional amounts so long as this does not compromise the objects of the invention.

In forming a pattern from the resist composition of the invention, any well-known lithography may be employed. For example, the composition is applied onto a substrate for integrated circuitry fabrication (e.g., Si, $SiO_2$, SiN, SiON, TiN, WSi, BPSG, SOG, organic antireflective coating, etc.) or a substrate for mask circuitry fabrication (e.g., Cr, CrO, CrON, MoSi, etc.) by a suitable coating technique such as spin coating. The coating is prebaked on a hot plate at a temperature of 60 to 150° C. for about 1 to 10 minutes, preferably 80 to 140° C. for 1 to 5 minutes, to form a resist film of 0.05 to 2.0 μm thick. A patterning mask having the desired pattern is then placed over the resist film, and the film exposed through the mask to an electron beam or to high-energy radiation such as deep-UV, excimer laser or x-ray in a dose of 1 to 200 $mJ/cm^2$, and preferably 10 to 100 $mJ/cm^2$. Alternatively, pattern formation may be performed by writing with an electron beam directly (not through a mask). Light exposure may be done by a conventional exposure process or in some cases, by an immersion process of providing liquid impregnation between the mask and the resist. In the case of immersion lithography, a protective coating which is insoluble in water may be used. The resist film is then post-exposure baked (PEB) on a hot plate at 60 to 150° C. for 1 to 5 minutes, and preferably at 80 to 140° C. for 1 to 3 minutes. Finally, development is carried out using as the developer an aqueous alkali solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV having a wavelength of 250 to 190 nm, excimer laser, x-ray, or electron beam. The desired pattern may not be obtainable outside the upper and lower limits of the above range.

The water-insoluble protective coating which is used in the immersion lithography is to prevent the resist coating from being leached and to improve water slippage at the coating surface and is generally divided into two types. The first type is an organic solvent-strippable protective coating which must be stripped, prior to alkaline development, with an organic solvent in which the resist coating is not dissolvable. The second type is an alkali-soluble protective coating which is soluble in an alkaline developer so that it can be removed simultaneously with the removal of solubilized areas of the resist coating. The protective coating of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective coating of the second type is formed.

Any desired step may be added to the pattern forming process. For example, after a photoresist film is formed, a step of rinsing with pure water (post-soaking) may be introduced to extract the acid generator or the like from the film surface or wash away particles. After exposure, a step of rinsing (post-soaking) may be introduced to remove any water remaining on the film after exposure.

EXAMPLE

Examples and Comparative Examples are given below by way of illustration and not by way of limitation. Mw is a weight average molecular weight as measured by gel permeation chromatography (GPC) versus polystyrene standards.

Examples 1 to 4 and Comparative Examples 1 to 6

Positive resist compositions of the formulation shown in Table 1 were prepared according to the standard procedure. The components were synthesized by well-known methods.

Components

Polymer A:

2-ethyladamantan-2-yl methacrylate: 3-hydroxy-1-adamantyl methacrylate: 2-oxotetrahydrofuran-3-yl methacrylate The copolymer had a compositional ratio of 50/20/30 mol % of the monomers in the described order and a Mw of 6,000.

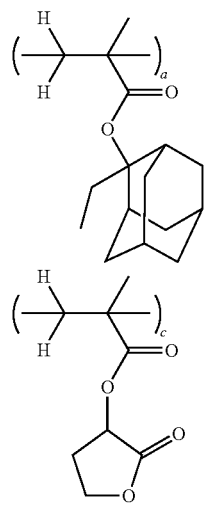

Polymer A
(a = 0.50, b = 0.20, c = 0.30)

Polymer B:

2-ethyladamantan-2-yl methacrylate: 3-hydroxy-1-adamantyl methacrylate: 2-oxotetrahydrofuran-3-yl methacrylate The copolymer had a compositional ratio of 30/20/50 mol % of the monomers in the described order and a Mw of 6,000.

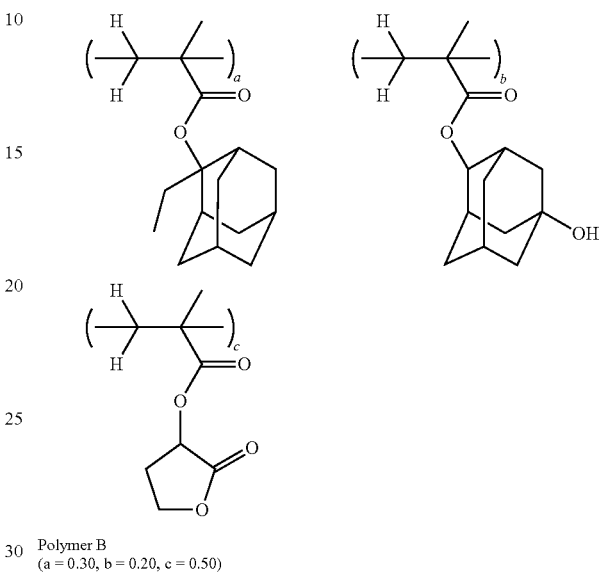

Polymer B
(a = 0.30, b = 0.20, c = 0.50)

B-1: tris[2-(methoxymethoxy)ethyl]amine

PAG-A: triphenylsulfonium perfluoro-1-butanesulfonate

PGMEA: propylene glycol monomethyl ether acetate

CyHO: cyclohexanone

C-1: diisopropylcarbodiimide (DIC)

DMT-MM: 4-(4,6-dimethoxy-1,3,5-triazin-2-yl)-4-methylmorpholinium chloride n-hydrate A-1: 1,2-epoxyoctadecane A-2: 1-naphthalene methanol R-1: 1-pentanol R-2: n-propylamine

TABLE 1

|  |  | Polymer (pbw) | Amine (pbw) | Additive 1 (pbw) | Additive 2 (pbw) |
|---|---|---|---|---|---|
| Example | 1 | Polymer A (100) | B-1 (0.05) | DMT-MM (0.1) | R-2 (0.1) |
|  | 2 | Polymer A (100) | B-1 (0.05) | C-1 (0.1) | R-1 (0.1) |
|  | 3 | Polymer B (100) | B-1 (0.05) | DMT-MM (0.1) | R-2 (0.1) |
|  | 4 | Polymer B (100) | B-1 (0.05) | C-1 (0.1) | R-1 (0.1) |
| Comparative Example | 1 | Polymer A (100) | B-1 (0.06) | A-1 (3) |  |
|  | 2 | Polymer A (100) | B-1 (0.06) | A-2 (3) |  |
|  | 3 | Polymer B (100) | B-1 (0.06) | A-1 (3) |  |
|  | 4 | Polymer B (100) | B-1 (0.06) | A-2 (3) |  |
|  | 5 | Polymer A (100) | B-1 (0.06) |  |  |
|  | 6 | Polymer B (100) | B-1 (0.06) |  |  |

The value in parentheses indicates an amount in parts by weight per 100 pbw of the polymer.

Besides the components shown in Table 1, all the resist compositions commonly contained 4 pbw of PAG-A as the acid generator and 896 pbw of PGMEA and 364 pbw of CyHO as the solvent.

Specifically, resist solutions were prepared by dissolving the selected components in a solvent mixture containing 0.01 wt % of surfactant KH-20 (AGC Seimi Chemical Co., Ltd.) and filtering through a Teflon® filter having a pore size of 0.2 µm.

Evaluation of Dissolution Contrast in ArF Lithography

Each of inventive resist compositions and comparative resist compositions was spin coated on a silicon wafer having an antireflective coating (ARC-29A, Nissan Chemical Co., Ltd.) of 78 nm thick and baked at 100° C. for 60 seconds to form a resist film of 170 nm thick. The wafer was open-frame exposed by means of an ArF excimer laser stepper 307E (Nikon Corp., NA 0.85, a 0.93), baked (PEB) at 110° C. for 60 seconds, and puddle developed with a 2.38 wt % tetramethylammonium hydroxide (TMAH) aqueous solution for 30 seconds, forming a line-and-space pattern. The open-frame exposure was performed on a dose-to-clear basis by effecting step-and-repeat exposure at shifting doses, measuring the thickness of film after development, and determining the dose as an exposure sensitivity (Eth) when the residual film thickness was 0.

For evaluation, comparison is made from a dissolution rate 0 to a dissolution rate necessary to dissolve away the resist pattern (a rate to clear a film of 170 nm thick in 30 seconds, 57 Å/sec). This is a dissolution rate necessary to form a resist pattern, and a proximity thereof is a boundary that determines whether or not the resist film is left. A sharp change of dissolution rate is advantageous for pattern formation because a moderate change of light quantity can be captured to determine the presence or absence of dissolution even when the light contrast upon exposure (bright or dark in the pattern area) is vague.

The results are plotted in FIGS. 1 to 4.

As seen from the results of FIG. 1, Example 1 has a lower dissolution rate at a dose of 5 to 6 mJ/cm$^2$ than Comparative Example 5 and a rapidly increasing dissolution rate at a more dose. Example 1 is thus regarded as a resist material having a higher contrast and better resolution.

Example 2 has a dissolution rate that starts sharply increasing from a dose of about 6 mJ/cm$^2$ as compared with Comparative Example 5. Example 2 is also regarded as a resist material having better resolution.

Figure 2:
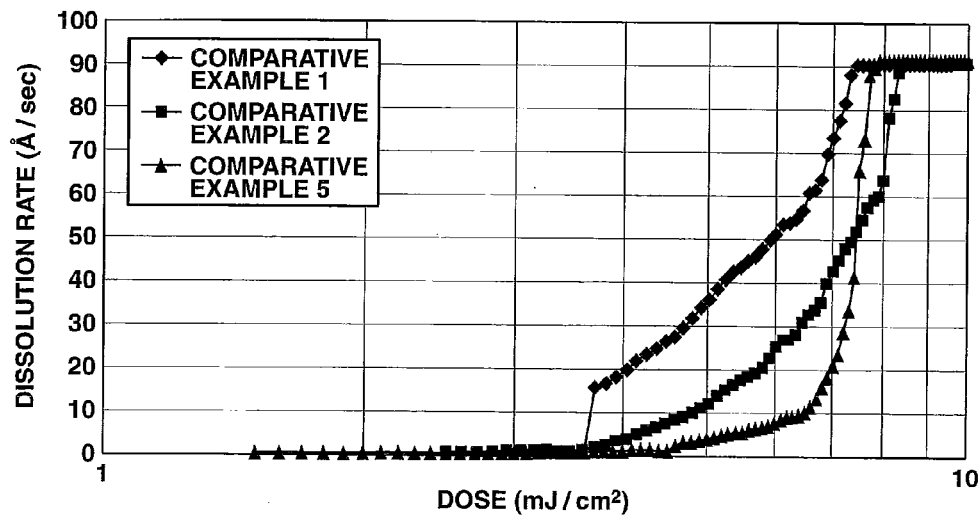
FIG. 2 is a diagram showing the results of evaluation of dissolution contrast in Comparative Examples 1, 2 and 5.

In contrast, FIG. 2 shows that Comparative Examples 1 and 2 which are intended to react a resin-solubilizing group with oxirane follow a moderate change of dissolution rate versus exposure dose, due to deteriorated dissolution contrast. This is because an alcohol resulting from acid-catalyzed ring opening of oxirane acts to promote dissolution as opposed to the intended object.

Figure 3:
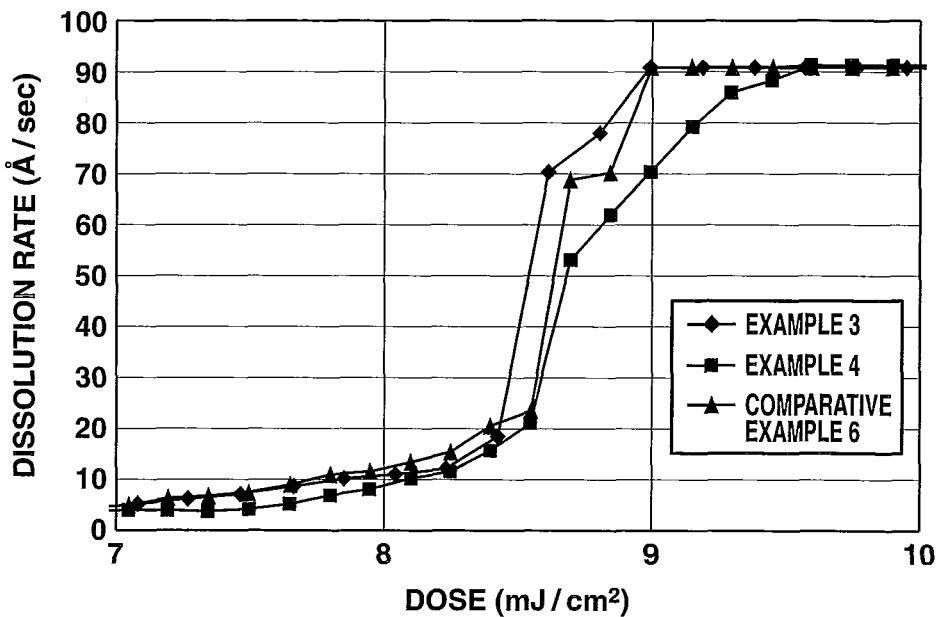
FIG. 3 is a diagram showing the results of evaluation of dissolution contrast in Examples 3 and 4 and Comparative Example 6.

It is evident from the results of FIG. 3 that Example 3 is improved over Comparative Example 6 in contrast until the dissolution rate necessary to dissolve away the resist pattern (a rate to clear a film of 170 nm thick in 30 seconds, 57 Å/sec). Example 4 shows inhibited dissolution in a dose region of incipient dissolution.

Figure 4:
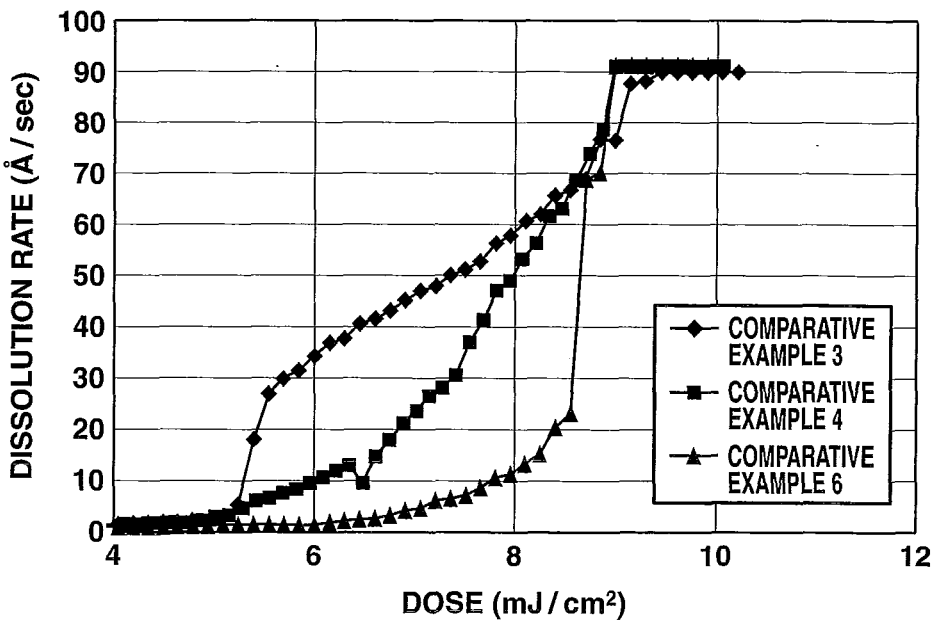
FIG. 4 is a diagram showing the results of evaluation of dissolution contrast in Comparative Examples, 3, 4 and 6.

It is evident from the results of FIG. 4 that as compared with Comparative Example 6, Comparative Example 3 appears to have a higher contrast of incipient dissolution in a low dose region due to good reactivity. Dissolution is promoted at the point of time when the amount of acid generated is small. Thereafter, the promoting effect is limitative in that dissolution is promoted as long as the formation of dissolution-promoting groups on the polymer is less, but the promoting effect does not last thereafter. As a result, the contrast near the necessary dissolution rate is reduced. Comparative Example 4 shows a moderate change of dissolution rate versus exposure dose.

Patterning Test in ArF Lithography

A patterning test was performed on the inventive resist compositions (Examples 1 to 4) and comparative resist compositions (Comparative Example 1 to 6). Each resist composition was spin coated on a silicon wafer having an antireflective coating (ARC-29A, Nissan Chemical Co., Ltd.) of 89 nm thick and baked at 100° C. for 60 seconds to form a resist film of 170 nm thick. The wafer was exposed by means of an ArF excimer laser stepper 307E (Nikon Corp., NA 0.85, a 0.93/0.70, 3/4 annular illumination, 6% half-tone mask), baked (PEB) at 110° C. for 60 seconds, and puddle developed with a 2.38 wt % TMAH aqueous solution for 30 seconds, forming a 1:1 line-and-space pattern.

The patterned wafer was observed under a top-down scanning electron microscope (TDSEM). The optimum exposure (Eop) was defined as the exposure dose (mJ/cm$^2$) which provided a 1:1 resolution at the top and bottom of a 80-nm 1:1 line-and-space pattern. The profile of the pattern was observed. The results are shown in Table 2.

TABLE 2

| | Eop (mJ/cm$^2$) | Profile |
|---|---|---|
| Example 1 | 49 | rectangular |
| Example 2 | 40 | rectangular |
| Example 3 | 48 | rectangular |
| Example 4 | 40 | rectangular |
| Comparative Example 1 | 38 | rounded top |
| Comparative Example 2 | 55 | rounded top |
| Comparative Example 3 | 44 | rounded top |
| Comparative Example 4 | 54 | rounded top |
| Comparative Example 5 | 47 | somewhat rounded top |
| Comparative Example 6 | 47 | somewhat rounded top |

The inventive resist compositions (Examples 1 to 4) were improved in performance since rectangular patterns were formed. Although dissolution due to scattering light is generally detected upon observation of a pattern surface profile (or top profile), Examples 1 to 4 are effective for suppressing such dissolution and affording rectangular patterns. Comparative resist compositions (Comparative Examples 1 to 6) resulted in pattern profiles with rounded top due to a drop of dissolution contrast.

Examples 5 to 11

Positive resist compositions of the formulation shown in Table 3 were prepared according to the standard procedure.

Components

C-2: 1,3-bis(2,2-dimethyl-1,3-dioxolan-4-ylmethyl)-carbodiimide (BDDC)

TA-1: (benzotriazol-1-yloxy)tripyrrolidinophosphonium hexafluorophosphate

TA-2: O-(7-azabenzotriazol-1-yloxy)-N,N,N',N'-tetramethyluronium hexafluorophosphate (HATU)

R-3: stearic amide

TABLE 3

|  | Polymer (pbw) | Additive 1 (pbw) | Additive 2 (pbw) | Additive 3 (pbw) |
|---|---|---|---|---|
| Example 5 | Polymer A (100) | C-1 (0.1) | R-1 (0.1) | TA-1 (0.1) |
| Example 6 | Polymer A (100) | C-1 (0.1) | R-1 (0.1) | TA-2 (0.1) |
| Example 7 | Polymer A (100) | C-1 (0.1) | R-2 (0.1) | TA-1 (0.1) |
| Example 8 | Polymer A (100) | C-1 (0.1) | R-2 (0.1) | TA-2 (0.1) |
| Example 9 | Polymer A (100) | C-2 (0.1) | R-2 (0.1) |  |
| Example 10 | Polymer A (100) | C-1 (0.1) | R-3 (0.1) |  |
| Example 11 | Polymer A (100) | C-1 (0.1) |  |  |

The value in parentheses indicates an amount in pbw per 100 pbw of the polymer.

Like Examples 1 to 4, all the resist compositions (Examples 5 to 11) commonly contained 4 pbw of PAG-A, 0.05 pbw of amine B-1, 1,100 pbw of PGMEA and 450 pbw of CyHO.

Evaluation of Resolution in ArF Lithography

Each of inventive resist compositions (Examples 1, 2, 5 to 11) and comparative resist composition (Comparative Example 5) was spin coated on a silicon wafer having an antireflective coating (ARC-29A, Nissan Chemical Co., Ltd.) of 89 nm thick and baked at 100° C. for 60 seconds to form a resist film of 170 nm thick. The wafer was exposed by means of an ArF excimer laser stepper S307E (Nikon Corp., NA 0.85, a 0.93/0.70, 3/4 annular illumination, 6% half-tone mask), baked (PEB) at 110° C. for 60 seconds, and puddle developed with a 2.38 wt % TMAH aqueous solution for 30 seconds, forming a 1:1 line-and-space pattern.

The patterned wafer was observed under a TDSEM. The optimum exposure (Eop) was defined as the exposure dose (mJ/cm$^2$) which provided a 1:1 resolution at the top and bottom of a 80-nm 1:1 line-and-space pattern. The maximum resolution of the resist was defined as the minimum line width (on-mask size, in increments of 2 nm) of a 1:1 line-and-space pattern that was resolved and separated at the optimum exposure, with smaller values indicating better resolution.

Table 4 tabulates the test results (optimum exposure, maximum resolution, and profile) of the inventive and comparative resist compositions.

TABLE 4

|  | Eop (mJ/cm$^2$) | Maximum resolution | Profile |
|---|---|---|---|
| Example 1 | 49 | 74 | rectangular |
| Example 2 | 40 | 74 | rectangular |
| Example 5 | 35 | 72 | rectangular |
| Example 6 | 37 | 72 | rectangular |
| Example 7 | 38 | 72 | rectangular |
| Example 8 | 38 | 72 | rectangular |
| Example 9 | 33 | 74 | rectangular |
| Example 10 | 34 | 74 | rectangular |
| Example 11 | 38 | 74 | rectangular |
| Comparative Example 5 | 47 | 80 | somewhat rounded top |

It is seen from the results of Table 4 that the resist compositions within the scope of the invention display improved resolution and a satisfactory pattern profile when processed by ArF excimer laser lithography.

Storage Stability Test in ArF Lithography

Samples of the resist compositions of Examples 1 and 2 and Comparative Example 5 were shelf stored at room temperature for 18 months. Thereafter, sample wafers for the test were prepared by the same procedure as described above for the evaluation of resolution. The test pattern was a 80-nm 1:1 line-and-space pattern. The optimum exposure (Eop) was determined from which a percent change of sensitivity was computed, and the pattern profile was observed. The results are shown in Table 5.

TABLE 5

|  | Eop (mJ/cm$^2$) | Change of sensitivity | Profile |
|---|---|---|---|
| Example 1 | 50 | +2% | rectangular |
| Example 2 | 41 | +3% | rectangular |
| Comparative Example 5 | 42 | −11% | rounded top |

The main cause for performance degradation during shelf storage is that the dissolution inhibitory effect is degraded as a result of some acid labile groups on the polymer being deprotected. The resist composition of the invention functions such that the thus generated carboxyl groups are protected again, preventing the performance degradation.

It has been demonstrated that the inventive resist composition displays improved resist performance over the resist composition of the prior art design. The resist composition is expected to display equivalent performance in the ArF immersion lithography using the same light source.

Examples 12 to 14 and Comparative Example 7

Positive resist compositions of the formulation shown in Table 6 were prepared according to the standard procedure.

Components

Polymer K:
  p-hydroxystyrene/2-ethyladamantan-2-yl methacrylate copolymer
  The copolymer had a compositional ratio of 70/30 mol % and a Mw of 10,000.

EL: ethyl lactate

PAG-B: 4-tert-butylphenyldiphenylsulfonium p-toluenesulfonate

PAG-C: bis(cyclohexylsulfonium)diazomethane

TABLE 6

|  | Polymer (pbw) | Additive 1 (pbw) | Additive 2 (pbw) |
|---|---|---|---|
| Example 12 | Polymer K (100) | C-1 (0.1) | R-1 (0.1) |
| Example 13 | Polymer K (100) | DMT-MM (0.1) | R-2 (0.1) |
| Example 14 | Polymer K (100) | C-1 (0.1) |  |
| Comparative Example 7 | Polymer K (100) |  |  |

The value in parentheses indicates an amount in pbw per 100 pbw of the polymer.

Like Examples 1 to 4, all the resist compositions (Examples 12 to 14, Comparative Example 7) commonly contained 2 pbw of PAG-B, 1 pbw of PAG-C, 0.3 pbw of amine B-1, 600 pbw of PGMEA and 250 pbw of EL.

Evaluation of Resolution in KrF Lithography

Each of the inventive resist compositions (Examples 12 to 14) and comparative resist composition (Comparative Example 7) was spin coated on a silicon wafer having an antireflective coating (DUV-42, Nissan Chemical Co., Ltd.) of 61 nm thick and baked at 100° C. for 90 seconds to form a resist film of 355 nm thick. The wafer was exposed by means of an KrF excimer laser stepper S203B (Nikon Corp., NA 0.68, a 0.75/0.50, 2/3 annular illumination, 6% half-tone mask), baked (PEB) at 110° C. for 90 seconds, and puddle developed with a 2.38 wt % TMAH aqueous solution for 30 seconds, forming a 1:1 line-and-space pattern.

The patterned wafer was observed under a TDSEM. The optimum exposure (Eop) was defined as the exposure dose (mJ/cm$^2$) which provided a 1:1 resolution at the top and bottom of a 130-nm 1:1 line-and-space pattern. The maximum resolution of the resist was defined as the minimum line width (on-mask size, in increments of 5 nm) of a 1:1 line-and-space pattern that was resolved and separated at the optimum exposure, with smaller values indicating better resolution.

Table 7 tabulates the test results (optimum exposure, maximum resolution, and profile) of the inventive and comparative resist compositions.

TABLE 7

| | Eop (mJ/cm$^2$) | Maximum resolution | Profile |
|---|---|---|---|
| Example 12 | 37 | 120 | rectangular |
| Example 13 | 40 | 120 | rectangular |
| Example 14 | 35 | 120 | rectangular |
| Comparative Example 7 | 40 | 130 | bulged top |

It is seen from the results of Table 7 that the resist compositions within the scope of the invention display improved resolution and a satisfactory pattern profile when processed by the KrF lithography.

The resist composition is expected to perform equally when processed by the EUV or EB lithography using polyhydroxystyrene derivatives.

Japanese Patent Application No. 2010-013777 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising:
   a compound which generates an acid in response to actinic light or radiation,
   a resin component which becomes soluble in an alkaline developer under the action of an acid, the resin component generating resin-solubilizing groups under the action of acid, at least some of the resin-solubilizing groups being carboxyl groups, and
   a compound for activating or condensing a carboxyl group, in the form of a carbodiimide or triazine base condensing agent.

2. The resist composition of claim 1, further comprising an alcohol compound, thiol compound, primary or secondary amine, carboxylic acid amide, or nitrogen-containing compound having a carboxyl group.

3. The resist composition of claim 1, further comprising a quencher as an acid diffusion regulator.

4. The resist composition of claim 1, further comprising a surfactant which is insoluble in water and soluble in the alkaline developer.

5. A process for forming a pattern, comprising the steps of applying the positive resist composition of claim 1 onto a substrate and heat treating to form a resist film, exposing the resist film to high-energy radiation through a photomask, optionally heat treating the film, and developing the exposed film with a developer.

6. A process for forming a pattern, comprising the steps of applying the positive resist composition of claim 1 onto a substrate and heat treating to form a resist film, applying onto the resist film a protective coating which is insoluble in water and soluble in an alkaline developer, exposing the resist film to high-energy radiation through a photomask while a high refractive index liquid having a refractive index of at least 1.0 is interposed between the substrate and a projection lens, optionally heat treating the film, and developing the exposed film with a developer.

7. A process for forming a pattern, comprising the steps of applying the positive resist composition of claim 1 onto a substrate and heat treating to form a resist film, writing an image in the resist film with electron beam, optionally heat treating the film, and developing the exposed film with a developer.

* * * * *